(12) United States Patent (10) Patent No.: US 10,640,875 B2
Kohtoku et al. (45) Date of Patent: May 5, 2020

(54) WET TYPE PROCESSING APPARATUS FOR RESIN FILM

(71) Applicants: JCU CORPORATION, Tokyo (JP); CHUO KIKAI CO., LTD, Kyoto (JP)

(72) Inventors: Makoto Kohtoku, Kanagawa (JP); Yaichiro Nakamaru, Kanagawa (JP); Yukio Shinozaki, Kanagawa (JP); Tetsuya Aoki, Tokyo (JP); Takashi Matsukura, Tokyo (JP); Goki Hashimoto, Kyoto (JP)

(73) Assignees: JCU CORPORATION, Tokyo (JP); CHUO KIKAI CO., LTD, Kyoto (JP)

( * ) Notice: Subject to any disclaimer, the term of this patent is extended or adjusted under 35 U.S.C. 154(b) by 2 days.

(21) Appl. No.: 16/068,996

(22) PCT Filed: Jan. 12, 2016

(86) PCT No.: PCT/JP2016/000126
§ 371 (c)(1),
(2) Date: Jul. 10, 2018

(87) PCT Pub. No.: WO2017/122229
PCT Pub. Date: Jul. 20, 2017

(65) Prior Publication Data
US 2019/0024238 A1 Jan. 24, 2019

(51) Int. Cl.
*C23C 18/16* (2006.01)
*H05K 3/18* (2006.01)
(Continued)

(52) U.S. Cl.
CPC ...... *C23C 18/1628* (2013.01); *C23C 18/1632* (2013.01); *H05K 3/187* (2013.01);
(Continued)

(58) Field of Classification Search
None
See application file for complete search history.

(56) References Cited

U.S. PATENT DOCUMENTS

| 4,269,138 A * | 5/1981 | Dinella | B05C 11/105 118/115 |
| 4,349,589 A * | 9/1982 | Dinella | B05C 11/105 427/359 |
| 5,353,979 A | 10/1994 | Gartmann | |

FOREIGN PATENT DOCUMENTS

| GB | 1224991 A | 3/1971 |
| JP | H59-118653 A | 7/1984 |

(Continued)

OTHER PUBLICATIONS

International Search Report dated Apr. 19, 2016 of corresponding International application No. PCT/JP2016/000126; 4 pgs.

(Continued)

*Primary Examiner* — Jethro M. Pence
(74) *Attorney, Agent, or Firm* — Maier & Maier, PLLC

(57) ABSTRACT

A wet type processing apparatus includes a processing bath for reserving inside the processing liquid and rendering the resin film pass through the processing liquid; a pair of conveyance members arranged on a loading side for the resin film of the processing bath and on a delivery side for resin film of the processing bath at a position higher than a liquid surface of the processing liquid reserved in the processing bath; and a spouting unit arranged between the pair of the conveyance members at a position lower than the conveyance members and formed with a circumferential surface having plural holes for spouting the processing liquid from the circumferential surface to change a direction of the resin film along the circumferential surface in a non-contact manner in the processing liquid according to spouted flows from the holes.

5 Claims, 29 Drawing Sheets

(51) Int. Cl.
*C23C 18/32* (2006.01)
*H05K 1/03* (2006.01)

(52) U.S. Cl.
CPC .......... *H05K 999/99* (2013.01); *C23C 18/32* (2013.01); *H05K 1/0393* (2013.01); *H05K 2201/0154* (2013.01); *H05K 2203/0165* (2013.01); *H05K 2203/072* (2013.01); *H05K 2203/1545* (2013.01); *H05K 2203/163* (2013.01)

(56) References Cited

FOREIGN PATENT DOCUMENTS

| | | | | |
|---|---|---|---|---|
| JP | H05-124759 A | 5/1993 | | |
| JP | 2000-247517 A | 9/2000 | | |
| JP | 2003-198097 A | 7/2003 | | |
| JP | 2003-252502 A | 9/2003 | | |
| JP | 2008-163407 A | * 7/2008 | ............... | C25D 7/06 |
| JP | 2009-099541 A | 5/2009 | | |
| JP | 2010-159478 A | 7/2010 | | |
| JP | 2011-174125 A | 9/2011 | | |
| JP | 2015-048532 A | 3/2015 | | |

OTHER PUBLICATIONS

Office Action dated Jul. 16, 2019, in corresponding Japanese Application No. 2017-561057; 15 pages.
Written Opinion dated Sep. 20, 2019, in corresponding Japanese Application No. 2017-561057; 12 pages.
Written Amendment dated Sep. 20, 2019, in corresponding Japanese Application No. 2017-561057; 7 pages.

* cited by examiner

WET TYPE PROCESSING APPARATUS FOR RESIN FILM

FIELD

This invention related to a wet type processing apparatus for resin film in which a web formed resin film is dipped in a prescribed processing liquid for making a prescribed processing on the surface of the resin film.

BACKGROUND

According to tendencies in mobile information terminals compacter in size with higher performance, high demands are growing for thin bendable flexible printed circuits (FPC). In accordance with these tendencies, it is also expected that the flexible printed circuits are made thinner, lighter, smaller while made in a further fine circuit rule with lower costs. Flexible copper clad laminates (FCCL) of inexpensive laminate type or cast type are currently used for flexible printed circuits, but those are unsuitable for forming finer circuitry or thinner size. To realize further smaller, lighter, and thinner flexible printed circuits as demanded in the market, it is necessary to use, e.g., flexible copper clad laminates of metalizing type in which a metal film is formed, but sputtering for forming a metal film on a film results in high costs, thereby making the costs of the flexible printed circuits high.

As an alternative technology such an expensive sputtering, a method for manufacturing flexible copper clad laminates using a comparatively inexpensive electroless plating method, e.g., see Patent Document #1, has been known. In use of the manufacturing method, a flexible copper clad laminate can be manufactured with the same performance as the flexible copper clad laminate of the on-going metalizing type and with lower costs.

Patent Document as Prior Art

Patent Document #1: Japanese Patent Application Publication No. 2010-159,478

A manufacturing apparatus using an electroless plating method generally chooses a polyimide film as the web formed resin film in using a continuous processing done by a roll to roll method, thereby making performance with high productivity. The thickness of the polyimide film conveyed by the roll to roll method is currently 25 microns to 50 microns as the majority, but in future a shift to a polyimide film having a thickness of 12.5 microns demanded in the FPC market is planned. The polyimide film having a thickness of 12.5 microns is, however, very thin and too delicate to be handled, and it is difficult to make plating fabrication by the roll to roll method because the film may be damaged or broken down with conventional conveyance technology.

Where a web formed resin film such as a polyimide film adsorbs metal ion catalysts serving as catalysts for electroless plating, metal ion catalysts are activated before the resin film is dipped in the electroless plating liquid. With this activation, the metal ions are reduced to weaken coupling force with carboxylic acid ions on the resin film, so that with the roll to roll method as done in a conventional method the metal ion catalysts easily fall off from the surface of the resin film at a time that the roll contacts the resin film, and so that it is difficult to attach a metal film having a good thickness.

In consideration to solve the above technical problems, it is therefore an object of the invention to provide a wet type processing apparatus for resin film realizing surface processing such as an electroless plating method to a resin film having relatively thin thickness.

SUMMARY

For solving the above technical problems, a wet type processing apparatus for resin film according to the invention is a wet type processing apparatus for resin film in which a web formed resin film is dipped in a prescribed processing liquid for making a prescribed processing on the surface of the resin film, the wet type processing apparatus comprising: a processing bath for reserving inside the processing liquid and rendering the resin film pass through the processing liquid; a pair of conveyance members arranged on a loading side for the resin film of the processing bath and on a delivery side for resin film of the processing bath at a position higher than a liquid surface of the processing liquid reserved in the processing bath; and a spouting unit arranged between the pair of the conveyance members at a position lower than the conveyance members and formed with a circumferential surface having plural holes for spouting the processing liquid from the circumferential surface to change a direction of the resin film along the circumferential surface in a non-contact manner in the processing liquid according to spouted flows from the holes.

In accordance with the wet type processing apparatus for resin film of the invention, the spouting unit provided between the pair of the conveyance members changes the direction of the resin film along the circumferential surface in a non-contact manner in the processing liquid, thereby preventing the thin resin film from receiving damages or being broken down. Because the resin film in the processing liquid does not contact with the spouting unit, the resin film prevents metal ion catalysts from falling off from the surface thereof.

DETAILED DESCRIPTION OF EMBODIMENTS

Figure 1:
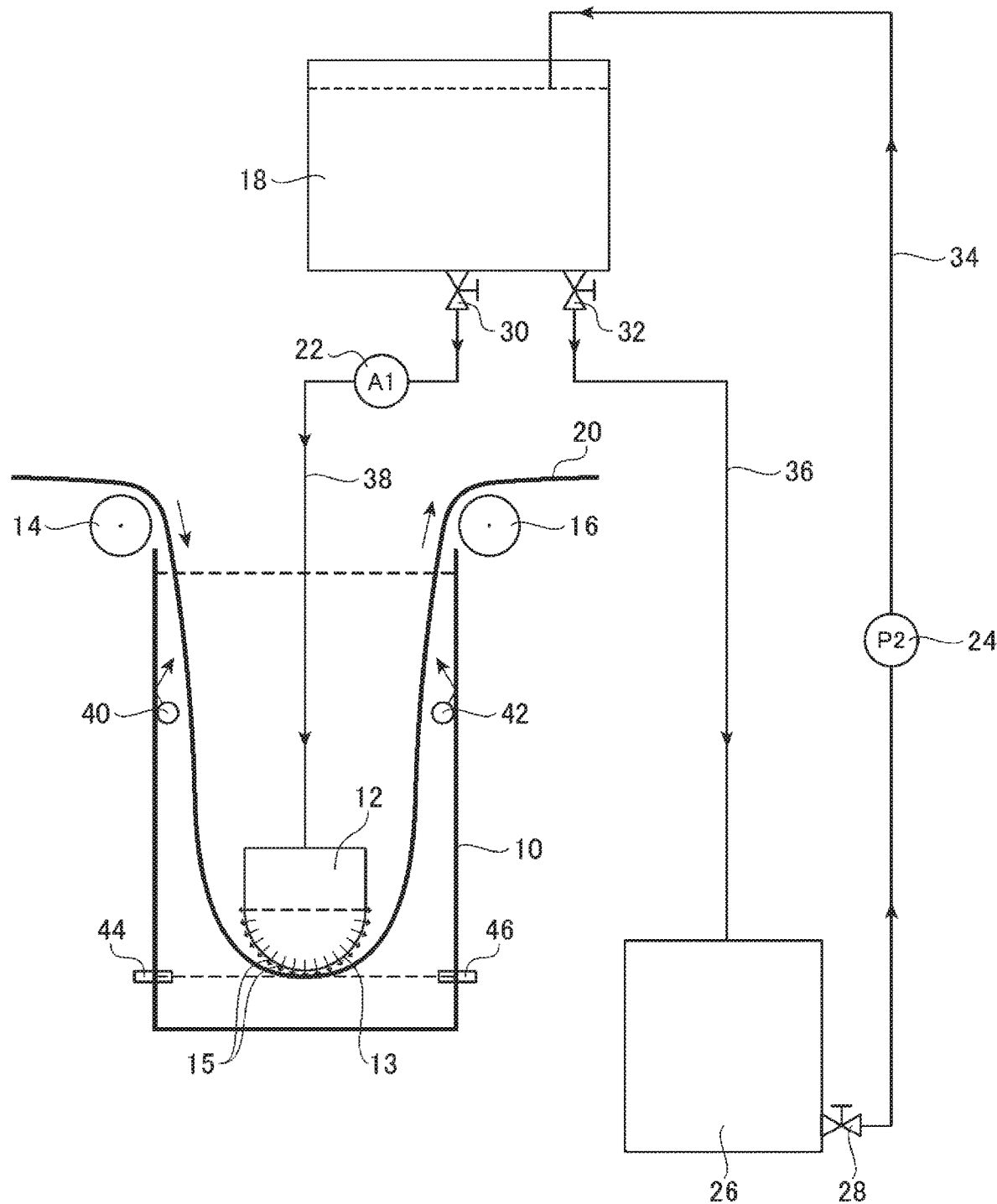
FIG. 1 is a structural diagram showing a plating apparatus according to a first embodiment of the invention.

Referring to the drawings, embodiments of the invention are described. It is to be noted that the following description are for embodiments of the invention, and the invention is not restricted to those embodiments. Arrangements and sizes of this invention also are not limited to those of each structural element shown in the drawings.

First Embodiment

This embodiment is an example of a plating apparatus of an up and down conveyance method for plating treatment serving as a wet type processing apparatus for resin film. The plating apparatus is arranged in a line for manufacturing flexible copper clad laminate (FCCL) in which a copper layer is formed as a conducting layer on a resin film such as, particularly, a polyimide film, and is used as an apparatus for forming nickel thin film as a seed layer by, e.g., an electroless plating method. With the plating apparatus according to this embodiment, although activated metal catalysts exist on the resin film prior to formation of the metal thin film, the resin film itself keeps non-contact with other except the plating liquid, so that the plating apparatus obviates falling off of the metal catalysts from the metal catalysts. The plating apparatus processes continuously and is suitable for making mass production in comparison with batch type processing because formed in the line for manufacturing the flexible copper clad laminate and using the web formed resin film as the base material.

Figure 2:
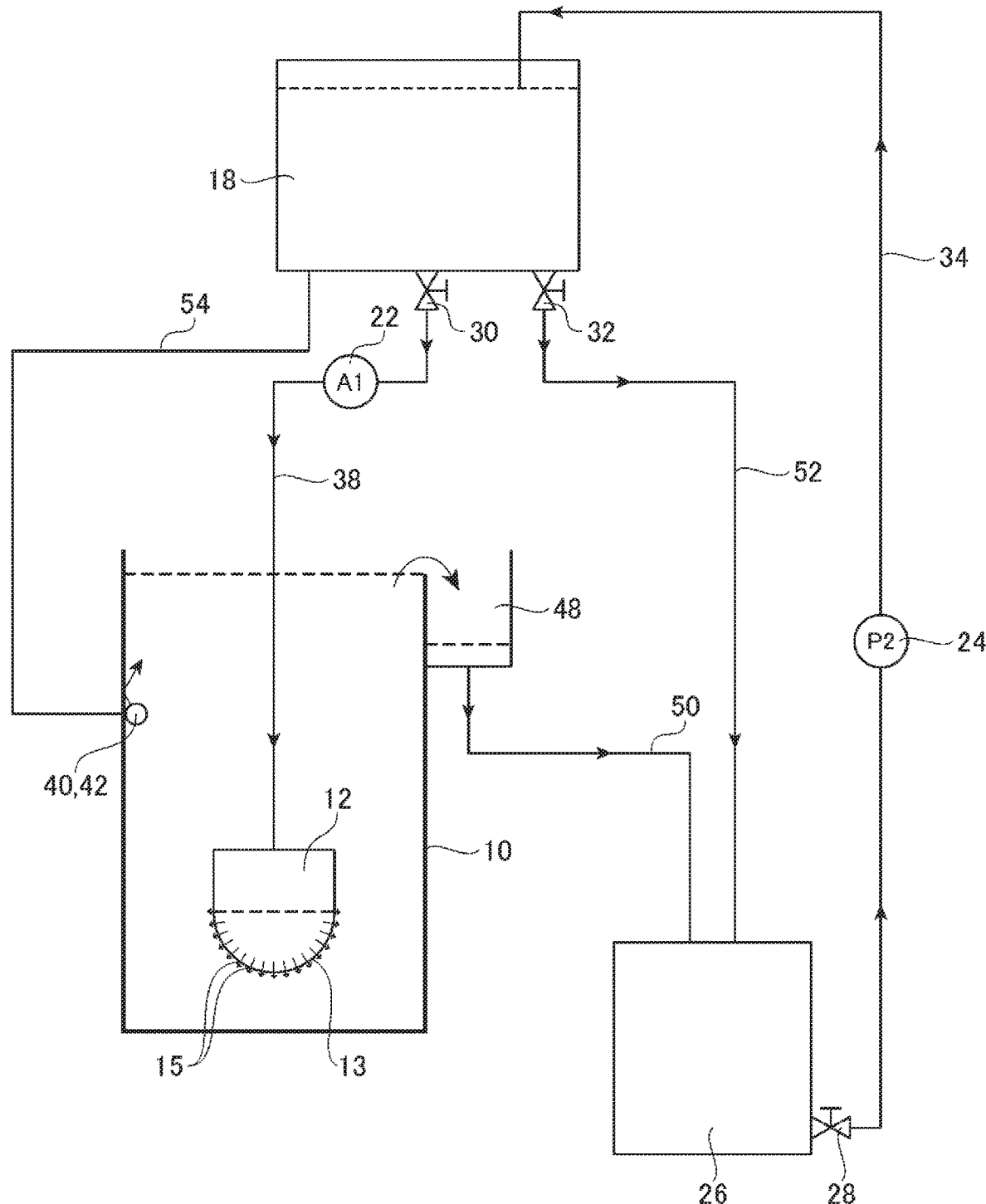
FIG. 2 is a pipe system diagram showing a piping system for the plating apparatus shown in FIG. 1.
Figure 3E:
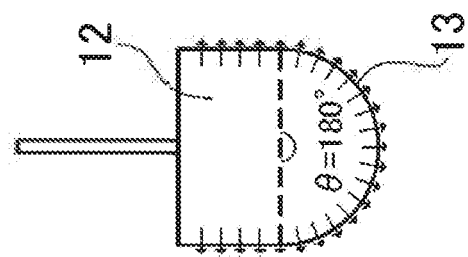
FIG. 3E is another schematic diagram showing an example of a spouting unit according to the first embodiment of the invention.
Figure 3D:
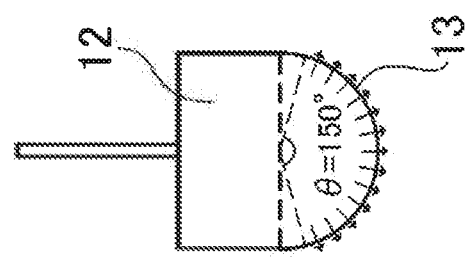
FIG. 3D is another schematic diagram showing an example of a spouting unit according to the first embodiment of the invention.
Figure 3C:
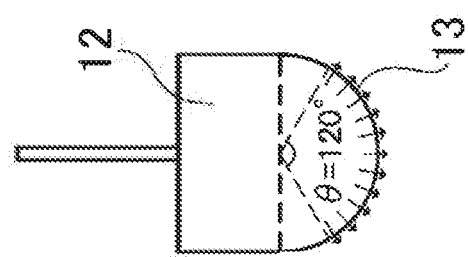
FIG. 3C is another schematic diagram showing an example of a spouting unit according to the first embodiment of the invention.
Figure 3B:
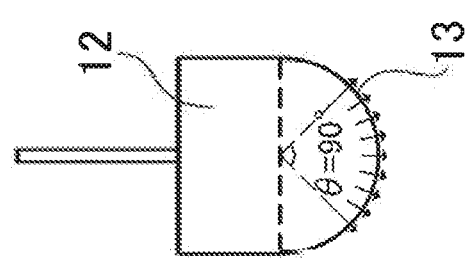
FIG. 3B is another schematic diagram showing an example of a spouting unit according to the first embodiment of the invention.
Figure 3A:
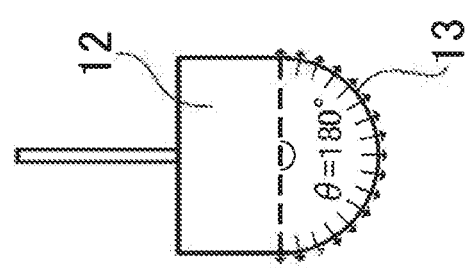
FIG. 3A is a schematic diagram showing an example of a spouting unit according to the first embodiment of the invention.

As shown in FIG. 1 and FIG. 2, the plating apparatus is an apparatus for performing plating processing in conveying the resin film 20 such as, e.g., web formed polyimide film, conveys continuously the resin film 20 so that a direction perpendicular to the conveyance direction is the horizontal direction, and adapts a conveyance route going down once and going up again inside the processing bath 10, or namely an up and down conveyance method. Where the film is moved not horizontally but up and down during passing through the plating liquid, bubbles generated in the plating liquid and attached to the surface of the resin film 20 are removed from the surface of the resin film 20 in the plating liquid; where the metal thin film is formed by plating, adverse effects due to bubbles can be minimized, and whole area occupied by the manufacturing line is made smaller.

The plating apparatus according to this embodiment includes, in order to dip the resin film 20 into the plating liquid, the processing path 10 reserving the plating liquid inside and passing the resin film in the plating liquid, and a loading roller 14 and a delivery roller 16 as a pair of conveyance members arranged on a loading side and on a delivery side of the processing bath 10 for the resin film 20, respectively, at positions higher than the liquid surface of the plating liquid reserved in the processing bath 10. A spouting unit 12 is arranged between the loading roller 14 and the delivery roller 16 at a lower position than the loading roller 14 and the delivery roller 16 for changing direction of the resin film along a circumferential surface 13 in a non-contact manner in the plating liquid.

The spouting unit 12 is a device having a hollow inside and a bottom side in a cylindrical shape and an upper side in a rectangular shape, and is made by fabrication of a resin such as, e.g., a polyvinyl chloride. The spouting unit 12 is formed to have a wider size than the width of the resin film 20 in the width direction of the resin film 20. The spouting unit 12 is secured to the processing bath 10 at the end in the width direction, but can be detachably attached to the processing bath 10; the spouting unit 12 can be structured as not secured but be movable in the processing bath 10 or can be made to be supported by being pended from a top of the processing bath 10. Plural holes 15 are formed to spout the plating liquid out of a circumferential surface formed in a cylindrical shape on a bottom side of the spouting unit 12, and according to the pressure of the plating liquid spouted from the holes 14, the resin film 10 to be conveyed are conveyed in the non-contact manner. The holes 15 are arranged in, e.g., lines in the circumferential surface 13 in the cylindrical shape on the bottom side of the spouting unit 12 and are through holes penetrating the structured plate of the circumferential surface 13. The holes 14 can be formed with plural holes having the same diameter, or with plural holes having different diameters in a mixed manner. Angles on the circumferential surface for forming the plural holes 15 are described below.

The spouting unit 12 is coupled to a plating liquid supply pipe 38, and the plating liquid supplied via the plating liquid supply pipe 38 is spouted out of the spouting unit 12 with a prescribed liquid pressure inside the processing bath 10. The spouting unit 12 for conveying the resin film 20 in the non-contact manner is coupled to a lower end of the plating liquid supply pipe 38, while a head tank 18 is coupled at a position higher than the processing bath 10 to an upper end of the plating liquid supply pipe 38. The head tank 18 is a bath temporarily reserving the plating liquid supplied by a pump 24 and supplying the plating liquid to the spouting unit 12, and can suppress pulsation of the plating liquid caused by operation of the pump 24 with respect to the spouting unit 12. The plating liquid supply pipe 38 coupling the head tank 18 with the spouting unit 12 is formed with a flowmeter 22 and a valve 30; a flow amount of the plating liquid supplied to the spouting unit 12 from the head tank 18 can be adjusted by manipulating the valve 30; and the flow amount is monitored with the flowmeter 22. The plating liquid from the head tank 18 is spouted through the spouting unit 12 to the interior of the processing bath 10 according to self-weight falling of the plating liquid. To convey the resin film 20 stably in the non-contact manner, it is effective to control the valve 30 installed in a midway of the plating liquid supply pipe 38 and also effective to adjust the angle of the plating liquid from the spouting unit 12 as described below. The size of the holes 15 formed in the circumferential surface 13 of the spouting unit 12 can be controlled in a known method; the level of the head tank 15 may be adjusted.

The processing bath 10 has a rectangular structure with an opening on a top side to convey the resin film 20, and is, as shown in FIG. 2, formed with an overflow bath 48 for collecting the plating liquid overflowed from the processing bath 10 on a top end and with a drain pipe 50 coupled from a bottom of the overflow bath 48 to a reservoir 26. Accordingly, even where the plating liquid is supplied at any time or always to the processing bath 10, the apparatus has a structure that the plating liquid does not flow out to the exterior of the apparatus from the processing bath 10. The plating liquid in the reservoir 26 is structured to be drawn by the pump 24 via the valve 28, and the plating liquid drawn by the pump 24 is supplied to the head tank 18. A drain valve 32 is provided at a bottom of the head tank 18, and the plating liquid of the head tank 18 can be returned to the reservoir 26 by opening the drain valve 32.

Figure 6:
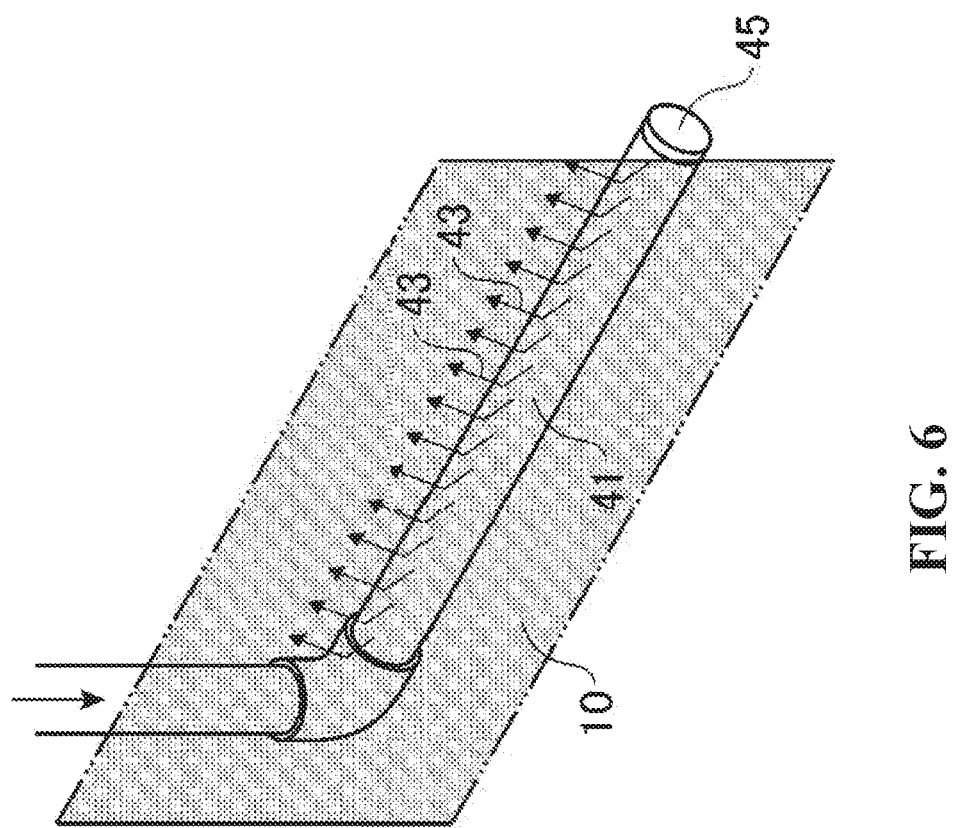
FIG. 6 is a schematic perspective view showing the wall surface spouting unit shown in FIG. 5.

Wall surface spouting units 40, 42 are arranged on side walls in the processing bath 10 for serving as second spouting units providing spouting to a wall surface. The wall surface spouting units 40, 42 are members in a pipe shape arranged on inner side walls of the processing bath 10, and are formed as extending in a longitudinal direction, which is the width direction of the resin film 20 or namely the horizontal direction. As shown in FIG. 6, plural spouting holes 43 are formed at a main body 41 of the wall surface spouting units 40, 42 in a line extending horizontally up to an end portion 45, and as described below, liquid flow spouting out of the plural spouting holes 43 can control the conveyance path of the resin film 20 to be a proper position. The wall surface spouting units 40, 42 give spouting to a surface of the resin film 20 opposite to the surface of the resin film 20 receiving the liquid pressure from the spouting unit 12. The plural spouting holes 43 formed in the main body 41 of the wall surface spouting units 40, 42 are formed not to be oriented directly toward the interior of the processing bath 10 but to be oriented toward the inner wall of the processing bath 10 from the main body 41, so that pressure of the plating liquid indirectly exerts on the resin film 20. By indirectly feeding the plating liquid from the wall surface spouting units 40, 42 to the surface of the resin film 20, the apparatus prevents the conveyed resin film 20 from sticking to edges or inner walls of the processing bath 10, thereby making the conveyance of the resin film 20 stable.

Figure 5:
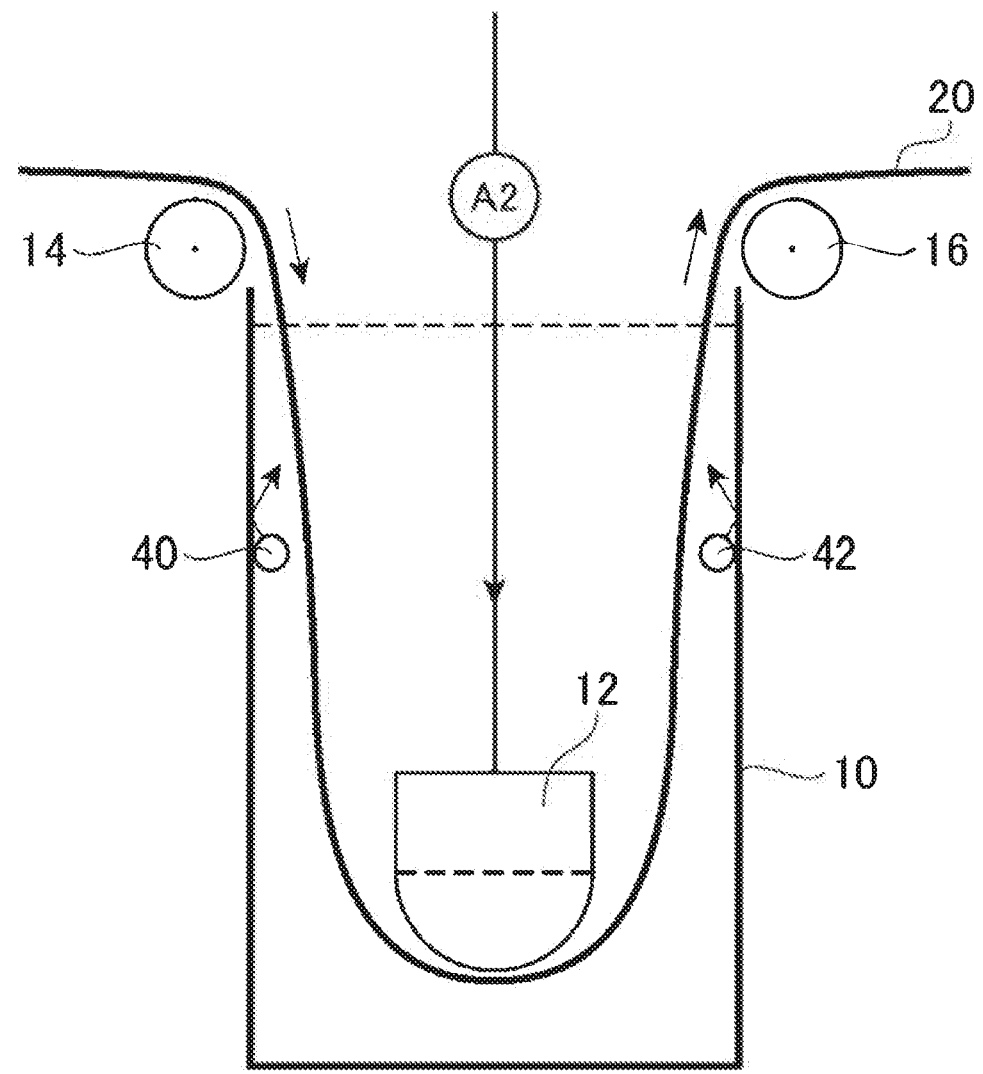
FIG. 5 is a structural diagram showing a wall surface spouting unit of the plating apparatus according to the first embodiment of the invention.
Figure 7:
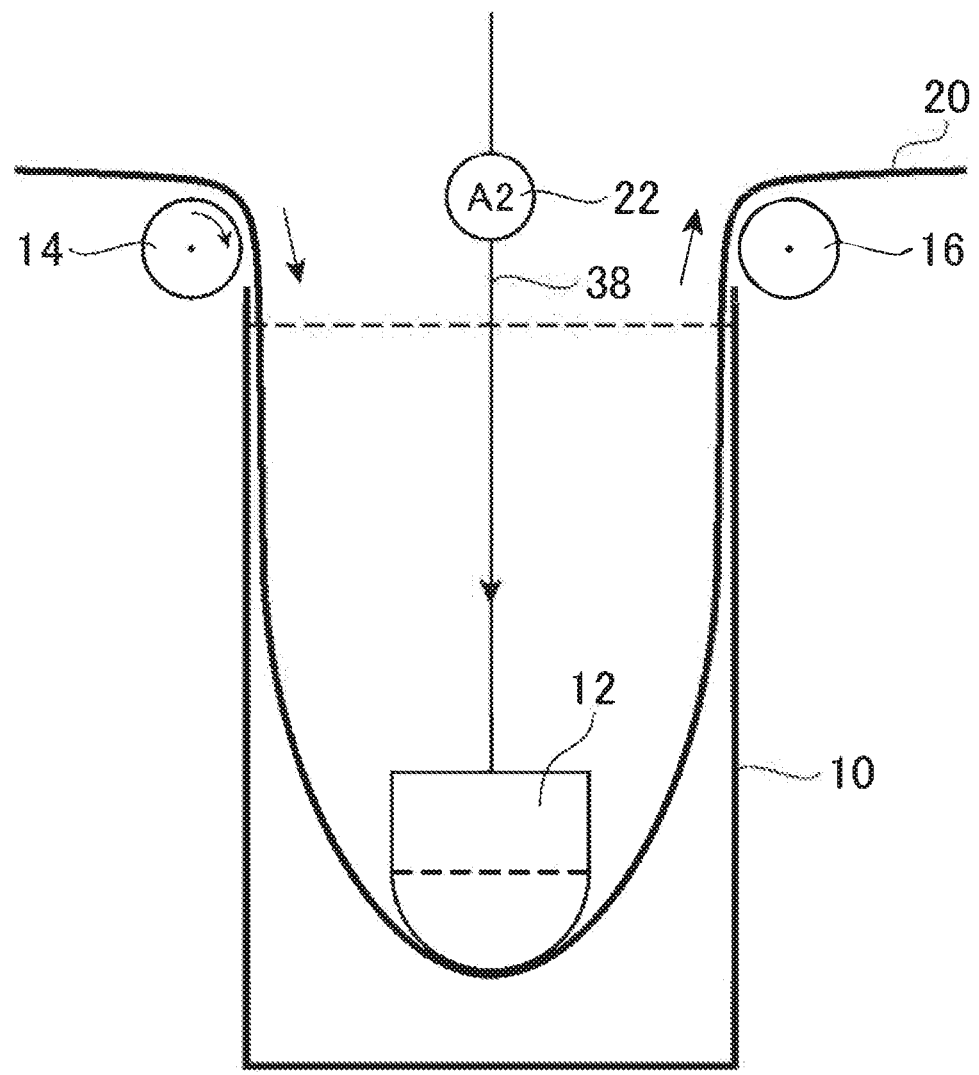
FIG. 7 is a structural diagram showing a plating apparatus having no wall surface spouting unit.

FIG. 5 is a structural diagram showing a plating apparatus having the wall surface spouting units 40, 42; FIG. 7 is a structural diagram showing a plating apparatus having no wall surface spouting units 40, 42 for the purpose of comparison. As shown in FIG. 7, with the apparatus structured with no wall surface spouting units 40, 42 on the side wall of the processing bath 10, the conveyed resin film 20 makes the conveyance path at a portion near the wall surface along the side wall of the processing bath 10 according to force received from the plating liquid from the spouting unit 12. The resin film 20 therefore may stick to edges or inner walls of the processing bath 10, and it becomes remarkable in a case that using the resin film 20 having a thin thickness such as, e.g., 12.5 microns. To the contrary, with the structure in which the wall surface spouting units 40, 42 are arranged on the side wall of the processing bath 10 as shown in FIG. 5, the resin film 20 does not stick to edges or inner walls of the processing bath 10 and passes through the proper conveyance path, thereby proceeding stable film conveyance.

The resin film 20 is a polyimide resin film having a thin thickness around, as described above, e.g., 25 microns or less, preferably 12.5 microns or less; the resin film 20 is typically an aromatic polyimide in which aromatic compounds are coupled directly with imide coupling and is having a conjugated structure among the aromatic groups via the imide coupling and having the highest thermal, mechanical, and chemical features among polymers from the imide coupling with these strong intermolecular forces. In this embodiment, employed are, e.g., Kapton (product name) made of DU PONT-TORAY CO., LTD, or UPILEX (product name) made of Ube Industries, Ltd.

Such a plating apparatus is used preferably for a processing apparatus for one process step in a continuous manufacturing line, and can be used for a formation process step of a metal seed layer in a manufacturing line for, e.g., flexible copper clad laminates in which a copper layer is formed as a conductive layer on the resin film 20. The applicant (assignee) of this application have proposed a method for manufacturing double layer flexible copper clad laminates (double layer FCCL) having the steps of including a formation process for seed layer of conductive metal such as Ni or Ni alloys in advance, and wet-processing of all steps for plating processing, for forming a thicker thickness, of copper conductive layer on the seed layer, in which the whole copper application step is done by one process step as a feature. For example, Japanese Patent Application Publication (A1) No. 2010-159,478 discloses those arts.

A method for manufacturing flexible copper clad laminate is briefly described. First, a preprocessing is implemented to make surface-modified the resin film surface of the polyimide flexible and excellent in heat resistance and chemical resistance to be hydrophilized. The surface-modifying method includes a formation of a polyamic acid modified layer on a surface of the film with an alkali wet type modification method. Subsequently, after Pd ion is absorbed on the surface of the resin film with palladium based catalyst, the absorbed Pd ion is subject to reduction treatment to render the absorbed Pd ion reduced to be metalized and to form a hydrophilic surface modified layer. With these series of variation behaviors by the alkali wet type modification method, where the polyimide resin is processed with an alkali solution, a part of the imide ring is cleaved upon subjecting to hydrolysis to produce amide group and carboxyl group. This produced carboxyl group easily exchanges cation to render the metal ion absorbed.

An electroless plating method renders plating of a conductive metal such as Ni or Ni alloy in advance on a resin film surface thus hydrophily surface-modified, thereby forming a seed layer of the conductive metal. At that time, the plating apparatus of the embodiment is used to feed the resin film 20 with non-contact conveyance utilizing the spouting unit 12. With this wet type electroless nickel plating method, it is advantageous to form a conductive nickel seed layer on double sides having a thickness around 10 to 300 nm, and with respect to Ni alloy, exemplified are alloys of, e.g., Ni—P, Ni—B, and Ni—Cu.

Subsequently, a wet electric plating is made in acidic copper plating bath compounds to plate a copper conductive layer with a thick thickness in freely controlling the layer thickness on the seed layer of the resin film at one step, thereby manufacturing a flexible copper clad laminate having a copper coated thickness in a range of 0.05 to 50 microns. The condition for copper plating with acidic copper plating bath compounds for the resin film formed with a metal coated film on the surface can be a condition for normal copper sulfate plating. That is, plating may be performed with the liquid temperature of 23 to 27 degrees Celsius and the mean cathode current density around 1 to 3 $A/dm^2$ for around 1 to 250 minutes. The copper plating is preferably done with liquid stirring such as, e.g., aeration.

In the manufacturing method for two-layer flexible copper clad laminate as described above, the entire processes can be made in wet type (all wet process) including the seed layer formation by electroless nickel plating that can be made inexpensively in an in-line manner, and the obtained two-layer flexible copper clad laminate can be used properly in response to finer patterns. The two-layer flexible copper clad laminate manufactured by copper plating with thick thickness without primary copper plating on the resin film formed in advance with the seed layer of the conductive metal coating film, provides a smooth gloss appearance, and the pealing resistance of the obtained copper plating layer is significantly improved.

Such a manufacturing method for two-layer flexible copper clad laminate is merely one example of application examples of the plating apparatus according to the embodiment, and the wet type processing apparatus for resin film according to the invention is applicable not only to plating but also entire wet processing. That is, the wet type processing apparatus for resin film according to the invention can be, e.g., wet etching apparatus, chemical liquid processing apparatus, cleaning apparatus, coating apparatus, and developing apparatus, and can be not an independent apparatus but an built-in component as a part of a large size manufacturing line, and a part mounted as a part of other processing apparatuses. The wet type processing apparatus for resin film according to the invention is provided between the preprocessing step and the post-processing step for forming copper layers, and premises that the web-formed resin film is supplied continuously, but can be structured to be supplied with a resin film taken up once after the preprocessing step, and also can be structured to render the resin film taken up once before the post-processing step.

In this embodiment, as a plating liquid introduced into the processing bath 10, a publicly known electroless nickel plating bath can be utilized. The condition may be set to concentration, temperature, and time recommended for electroless nickel plating bath. It is to be noted that as the electroless nickel plating bath, employed are, e.g., electroless Ni—P plating, electroless Ni—B plating, and electroless Ni plating, and it is not particularly limited but it is preferable to use Ni—P based electroless nickel plating bath. As one example for use chemical agents, ES-500 (made by JCU Corporation) is used, and the processing temperature can be set to, e.g., 40 degrees Celsius.

With the plating apparatus of the embodiment, if the spouting flow from the spouting unit 12 much pushes the resin film 20, the conveyance can be made stable but may fall off palladium on the plating precipitated surface to render the plating film thickness thin on the front surface of the resin film 20 on the spouting side, thereby generating film thickness differences between the front surface and the back surface of the resin film to which no spouting flow pushes, resulting in uneven plating thicknesses between the front and back surfaces. In the plating apparatus according to the embodiment, the spouting amount is limited, and the spouting flow from the holes 15 of the spouting unit 12 is set to 100 liters per minute or less, preferably 75 liters per minute or less, and more preferably 50 liters per minute or less. This is obtained through experiments done by the inventors of this application, and resulted in approximately even thickness between the front surface and the back surface with a low spouting amount of 100 liters per minute or less, preferably a low spouting amount of 75 liters per minute or less, and more preferably a low spouting amount of 50 liters per minute or less.

Next, spouting angle of the spouting unit 12 changing direction of the resin film 20 along the circumferential surface 13 is described in reference with FIG. 3. The spouting unit 12 of the plating apparatus according to the embodiment has a lower side half in a cylindrical shape and is structured to spout the plating liquid via holes 15 formed in the circumferential surface 13 and arranged in a radial manner from a center thereof. The profile of the holes 15 at the cross section of the spouting unit 12 cut along the conveyance direction of the film is set to decide the spouting angle of the spouting unit 12. FIG. 3A is for the spouting angle θ of the spouting unit 12 of 180 degrees; FIG. 3B is for the spouting angle θ of the spouting unit 12 of 90 degrees; FIG. 3C is for the spouting angle θ of the spouting unit 12 of 120 degrees; FIG. 3D is for the spouting angle θ of the spouting unit 12 of 150 degrees; FIG. 3E is for the spouting angle θ of the spouting unit 12 of 180 degrees and for a structure formed with holes at the rectangular portion above the cylindrical portion. Where those shapes are compared, the spouting units 12, FIG. 3A and FIG. 3E, having the spouting angle θ of 180 degrees brought good conveyance stability of the resin film 20 rendering the distance from the circumferential surface 13 to the resin film 12 almost constant as around 3 mm. The spouting units 12, FIG. 3B through FIG. 3D, having the spouting angles θ of 90 degrees to 150 degrees, can also form necessary conductive nickel seed layers of 10 to 300 nano meters on the double sides.

Figure 4:
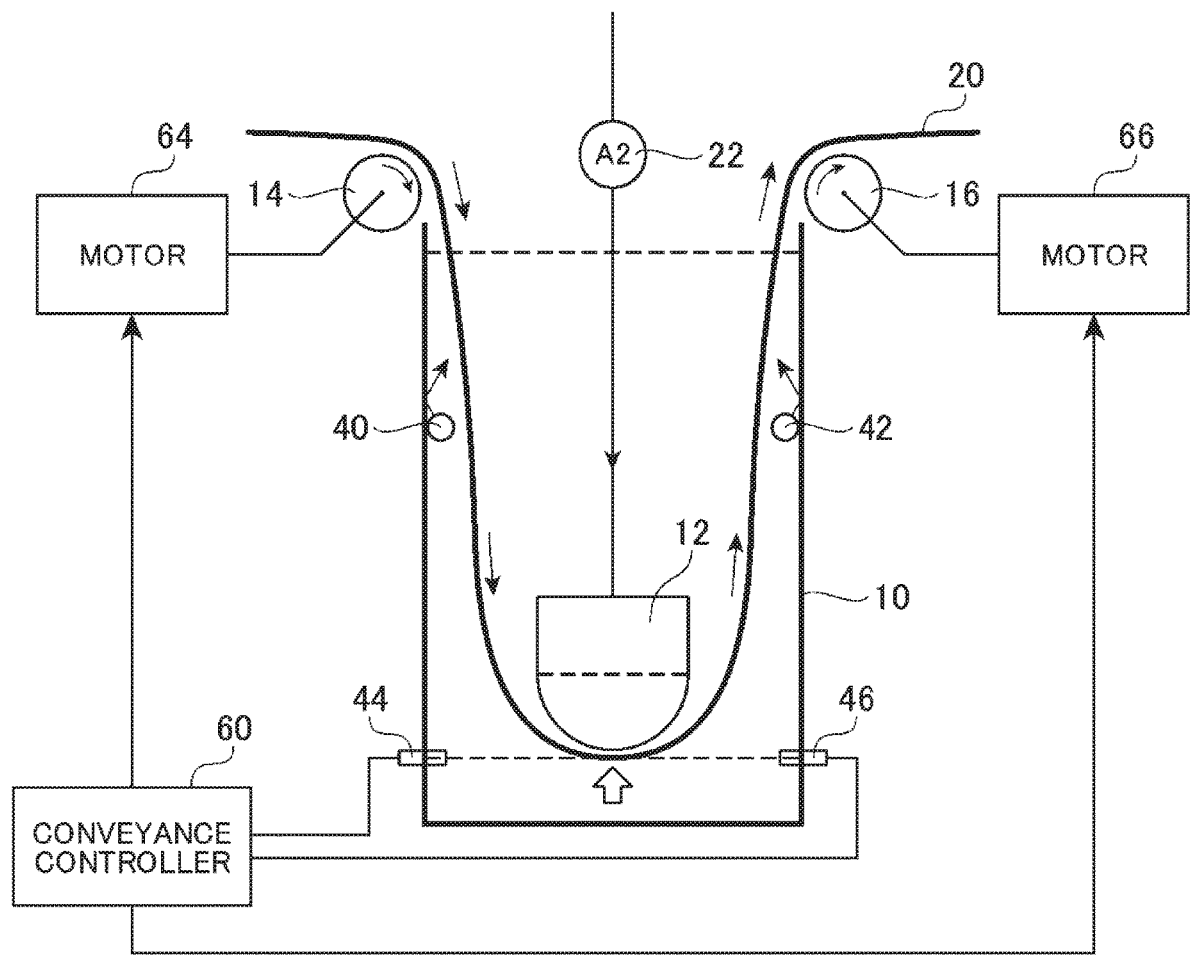
FIG. 4 is a diagram showing a control system of the plating apparatus according to the first embodiment of the invention.

The plating apparatus of the embodiment handles the resin film 20 having a thickness thinner than that of conventional resin films, and therefore it is very important to prevent the resin film from being fed in a meander manner and to make the conveyance speed stable. With a feedback control system shown in FIG. 4, the plating apparatus can form plating films evenly on the double sides of the resin film 20. The conveyance status of the resin film 20 is normally monitored by transmission type sensors 44, 46, and signals as monitored results are sent to a conveyance controller 60. The transmission type sensors 44, 46 are constituted of one, a light emitting element, and the other, a photo-receiving element. The sensors 44, 46 monitor as to whether the resin film 20 interrupts the light emitted from the light emitting element from the attached position thereof. For example, a position at which the sensors 44, 46 monitor the position of the resin film 20 is a position of around 1 to 15 mm, preferably of around 3 to 10 mm, from the bottom portion of the spouting unit 12. The conveyance controller 60 is structured to control a motor 64 driving the loading roller 14 and a motor 66 driving the delivery roller 16.

As an example of feedback control, when the resin film 20 comes closer to the spouting unit 12, the light transmits between the sensors 44, 46, and the conveyance controller 60, upon reception of the signal from the sensors 44, 45, controls to accelerate the rotation speed of the loading roller 14 arranged at an inlet of the processing bath 10 by sending signals to the motor 64. Then, the distance between the resin film 20 and the bottom of the spouting unit 12 becomes longer. Conversely, if the resin film 20 moves away from the spouting unit 12, the light is interrupted between sensors 44, 46, and conveyance controller 60, upon reception of the signal from the sensors 44, 45, controls to decelerate the rotation speed of the loading roller 14 arranged at the inlet of the processing bath 10 by sending signals to the motor 64. The distance between the resin film 20 and the bottom of the spouting unit 12 consequently becomes shorter. The control of the motor by the conveyance controller 60 can be done to the motor 66, and in such a situation, the rotation speed of the delivery roller 16 is controlled. The motor control done by the conveyance controller 60 can be for both of the motor 64 and the motor 66, and where one is controlled to be with a faster rotation speed while the other is controlled to be with a slower rotation speed, a quick feedback control is possible. Accordingly, with this feedback control, the distance between the spouting unit 12 and the resin film 20 can be maintained properly, thereby allowing the film to be conveyed stably.

Figure 8:
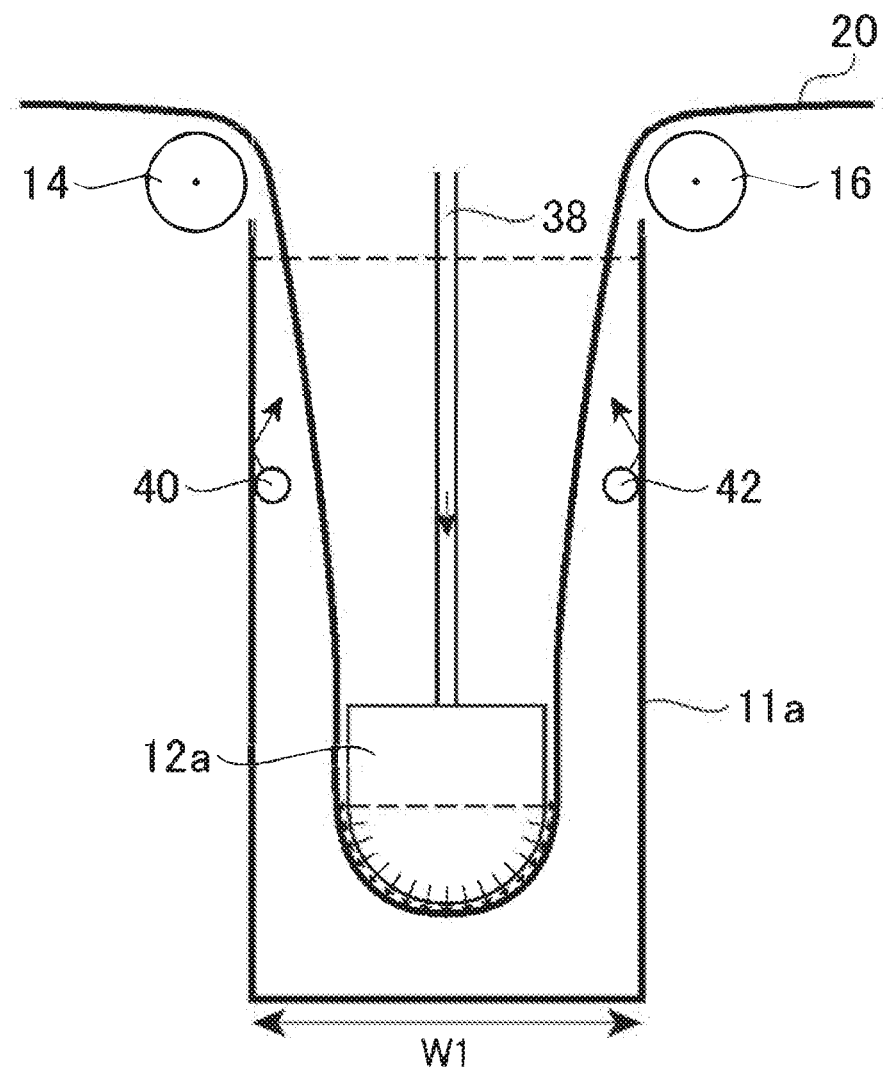
FIG. 8 is a structural diagram showing one of modified embodiments of the plating apparatus according to the first embodiment of the invention.
Figure 9:
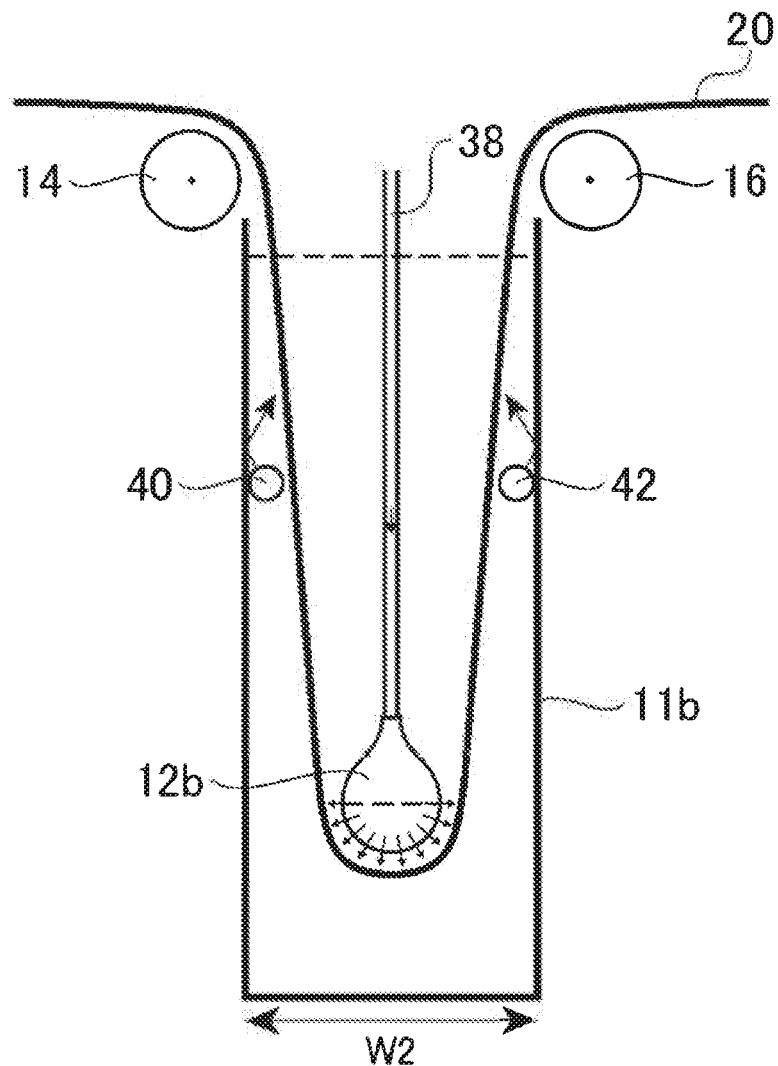
FIG. 9 is a structural diagram showing another one of modified embodiments of the plating apparatus according to the first embodiment of the invention.

FIG. 8 and FIG. 9 show modified examples of the plating apparatus according to the first embodiment. The modified example of the plating apparatus of the first embodiment as shown in FIG. 8 is designed to have a processing bath 11a with a narrower span W1 in comparison with the previous embodiment, and has a structure to make shorter the distance between the loading roller 14 and the delivery roller 16 and make smaller the occupied area of the whole manufacturing line. Where the distance between the loading roller 14 and the delivery roller 16 is made shorter, and where the position of the spouting unit 12a in the processing bath 11a is the same as that of the plating apparatus shown in FIG. 1, the conveyance path of the resin film 20 from the loading roller 14 to the spouting unit 12a becomes a steeper down slope, while the conveyance path of the resin film 20 from the spouting unit 12a to the delivery roller 16 becomes a steeper up slope, thereby rendering the installation area compacter, and thereby rendering good bubble discharge from the surface of the resin film 20, so that the plating film can be formed with an even thickness.

A modified example of the plating apparatus of the first embodiment as shown in FIG. 9 is an example using a processing bath 11b having a further narrower span W2, and the spouting unit 12b arranged inside is in a cross-sectionally spindle shape in having a size corresponding to a further narrower span W2. By using the spouting unit 12b in the spindle shape thus formed, the apparatus can prevent the resin film 20 from contacting the side wall of the spouting unit 12b, and can make stable the interval between the resin film 20 and the spouting unit 12b by forming a liquid pool at a shoulder portion of the spindle shape. The apparatus also can prevent the resin film 20 from contacting the spouting unit 12b as well as can make stable the conveyance of the resin film 20. Where the processing is made with weak liquid flow, it is preferable to design the diameter smaller where the spouting unit is set to the spindle shape. As a result, the capacities of the head tank, the processing bath 11b, and the reservoir 26 can be made smaller, respectively, thereby reducing the necessary chemical liquid amount, and thereby reducing processing costs, waste liquid processing costs, and further, environmental loads.

Second Embodiment

Figure 10:
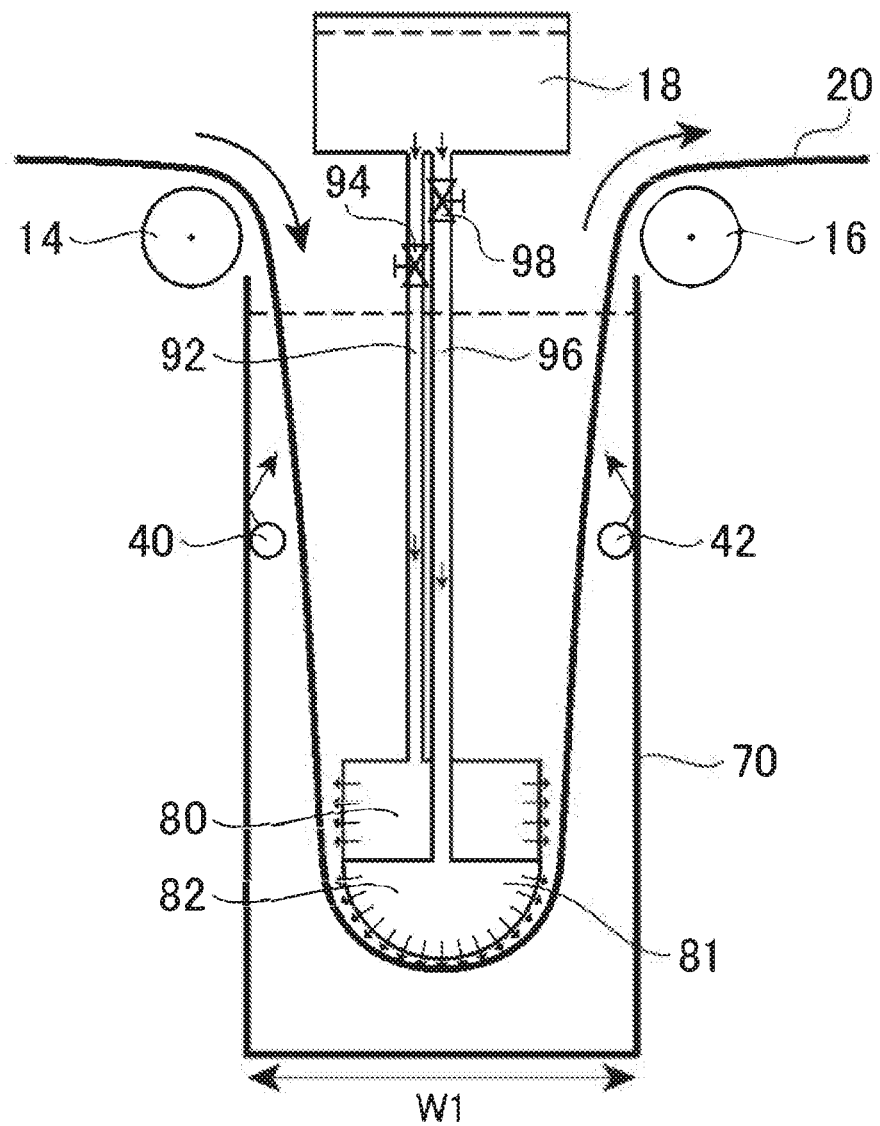
FIG. 10 is a structural diagram showing a plating apparatus according to a second embodiment of the invention.
Figure 11:
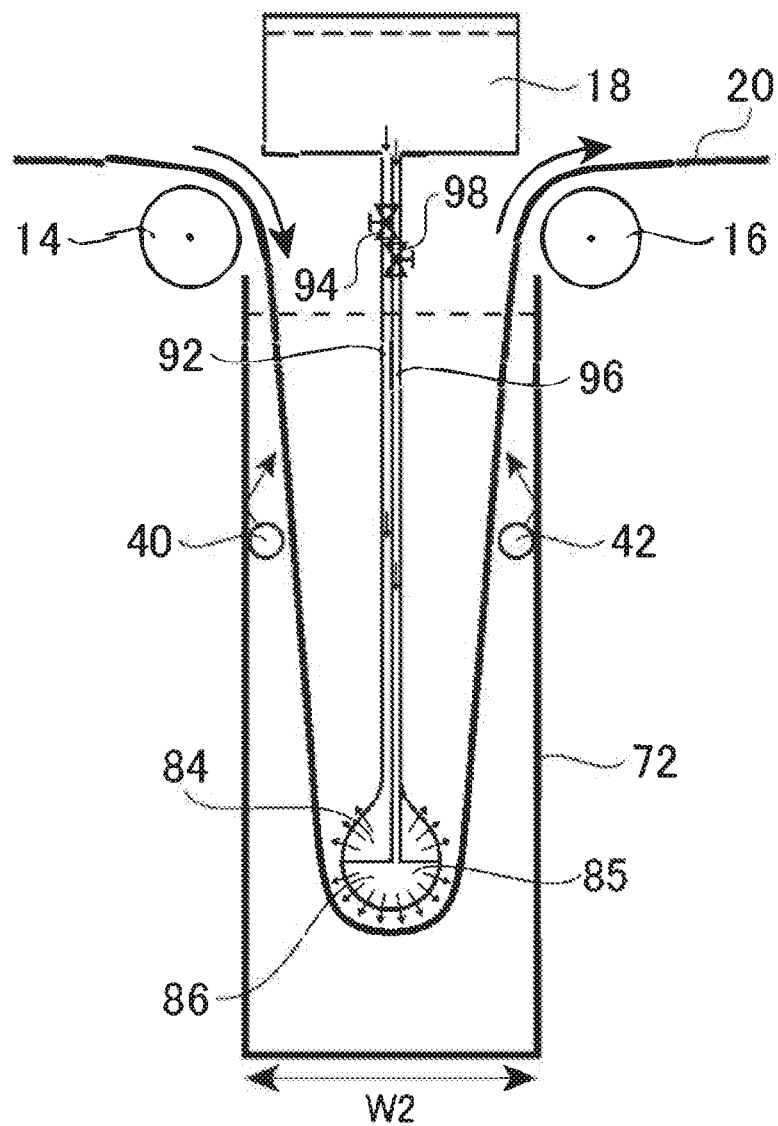
FIG. 11 is a structural diagram showing one of modified embodiments of the plating apparatus according to the second embodiment of the invention.
Figure 12:
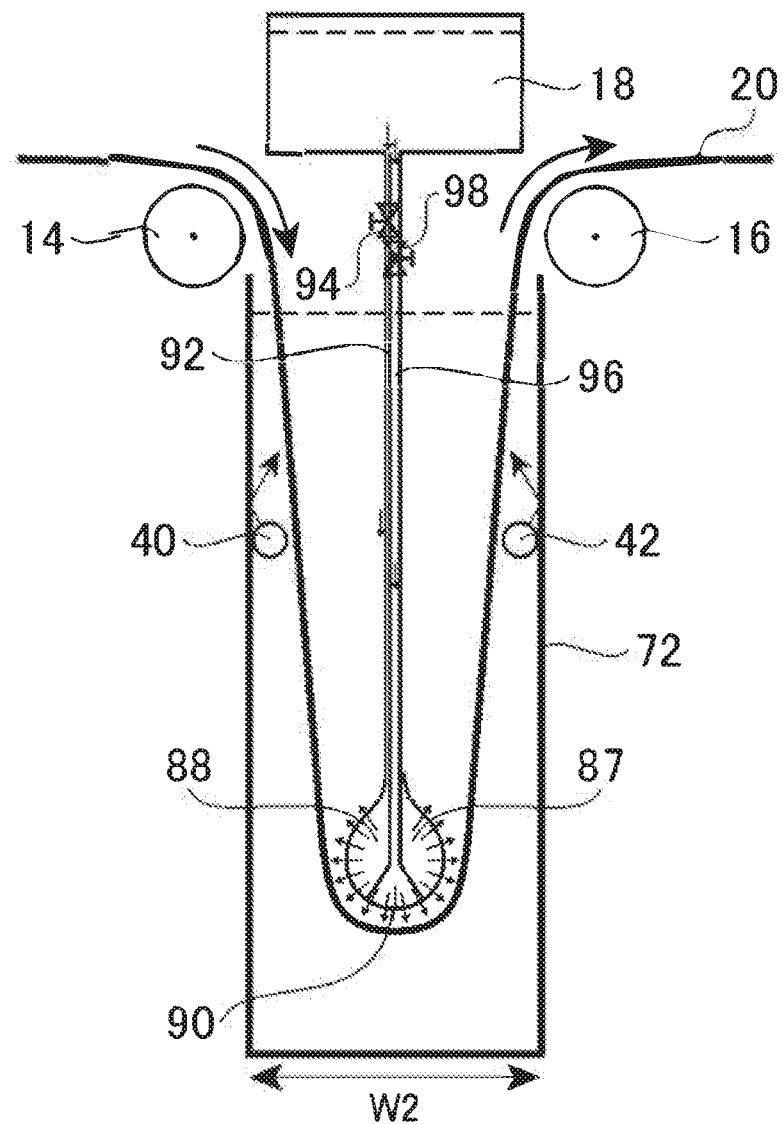
FIG. 12 is a structural diagram showing another one of modified embodiments of the plating apparatus according to the second embodiment of the invention.

This embodiment is an example of a plating apparatus whose spouting unit has two or more chambers separated with each other, and has a structure shown in FIG. 10 to FIG. 12, respectively. It is to be noted that where the plating apparatus in this embodiment has the same structural elements as those of the plating apparatus in the previous embodiment, the same reference numbers are assigned, and duplicated descriptions are omitted.

The plating apparatus of this embodiment shown in FIG. 10, has a processing bath 70 with a relatively narrow span W1, and a spouting unit 81 arranged inside includes a first chamber 80 disposed on an upper side of the unit and a second chamber 82 disposed on a lower side of the unit. Those first chamber 80 and second chamber 82 are not in liquid communication with each other, and are coupled to the head tank 18 via plating liquid supply pipes 92, 96 independent to each other. The first chamber 80 is coupled to the head tank 18 via the plating liquid supply pipe 92 and a valve 94. The second chamber 82 is coupled to the head tank 18 via the plating liquid supply pipe 96 and a valve 98. The first chamber 80 has holes for spouting the plating liquid at an upper half of the spouting unit 81, and can discharge the spouting flow in the horizontal directions from those holes. The second chamber 82 has holes for spouting the plating liquid at a lower half of the spouting unit 81, and can discharge the spouting flow in the radial directions along the circumferential surface of the spouting unit 81.

Because the plating liquid supply pipes 92, 96 are independent supply routes, the flow amounts in the supply pipes can be controlled independently by manipulating the valves 94, 98, so that the processing can be performed in combination of the first chamber 80 and the second chamber 82 advantageous for forming an uniform plating film. By controlling the flow amounts from the first chamber 80 and the second chamber 82, respectively, in the spouting unit 81, the position from the spouting unit with respect to the resin film 20 can be made stable. It is desirable to supply the liquid to the chambers 80, 82 via the head tank 18. According to the plating apparatus of the embodiment shown in FIG. 10, the apparatus can prevent the resin film 20 from contacting the spouting unit 81, thereby making the conveyance stable.

The plating apparatus of the embodiment shown in FIG. 11 has a spouting unit 85 arranged inside and formed in a cross-sectionally spindle shape. The plating apparatus has a size corresponding to a further narrower span W2, and the relatively compact spouting unit 85 includes a first chamber 84 disposed on an upper side of the unit and a second chamber 86 disposed on a lower side of the unit. Those first chamber 84 and second chamber 86 are not in liquid communication with each other, and are coupled to the head tank 18 via plating liquid supply pipes 92, 96 independent to each other. The first chamber 84 is coupled to the head tank 18 via the plating liquid supply pipe 92 and the valve 94. The second chamber 86 is coupled to the head tank 18 via the plating liquid supply pipe 96 and the valve 98. The first chamber 84 has holes for spouting the plating liquid at an upper half of the spouting unit 85, and can discharge the spouting flow in the radially upward directions from those holes. The second chamber 86 has holes for spouting the plating liquid at a lower half of the spouting unit 85, and can discharge the spouting flow in the radially downward directions along the circumferential surface of the spouting unit 85.

According to the plating apparatus shown in FIG. 11, in substantially the same way as the plating apparatus shown in FIG. 10, because the plating liquid supply pipes 92, 96 are independent supply routes, the flow amounts in the supply pipes can be controlled independently by manipulating the valves 94, 98, so that the processing can be performed in combination of the first chamber 84 and the second chamber 86 advantageous for forming an uniform plating film, and so that during the processing, the position of the passing resin film 20 can be made stable.

The plating apparatus shown in FIG. 12 has a spouting unit 87 formed in a cross-sectionally spindle shape, which is substantially the same as that of the plating apparatus shown in FIG. 11, including a first chamber 88 disposed on an upper side of the unit and a second chamber 90 disposed on a lower side of the unit. The first chamber 88 disposed on the upper side of the unit is extended further to a bottom side than the plating apparatus shown in FIG. 11, and the second chamber 90 is disposed as to be compact at the bottom. With this structure, because the plating liquid supply pipes 92, 96 are independent supply routes, the flow amounts in the supply pipes can be controlled independently by manipulating the valves 94, 98, so that the processing can be performed in combination of the first chamber 88 and the second chamber 90 advantageous for forming an uniform plating film, and so that during the processing, the position of the passing resin film 20 can be made stable.

In the above embodiment, the number of the chambers is described as two, but the apparatus may be formed with three or more chambers. The supply pipes supplying the plating liquid to the respective chambers are described for supplying the plating liquid from the same head tank 18, but plural head tanks can be provided respectively, and it is possible to divide the head tank into subsections with partition walls. The supply pipes supplying the plating liquid to the respective chambers can have the same diameter, but can have diameters different from each other.

Third Embodiment

As shown in FIG. 13A, FIG. 13B, FIG. 14A, and FIG. 14B, this embodiment is a plating apparatus including a rudder member 102 in the spouting unit 100, and a mechanism for controlling the plating liquid spouting from the spouting unit 100. It is to be noted that where the plating apparatus in this embodiment has the same structural elements as those of the plating apparatus in the previous embodiment, the same reference numbers are assigned, and duplicated descriptions are omitted.

Figure 13A:
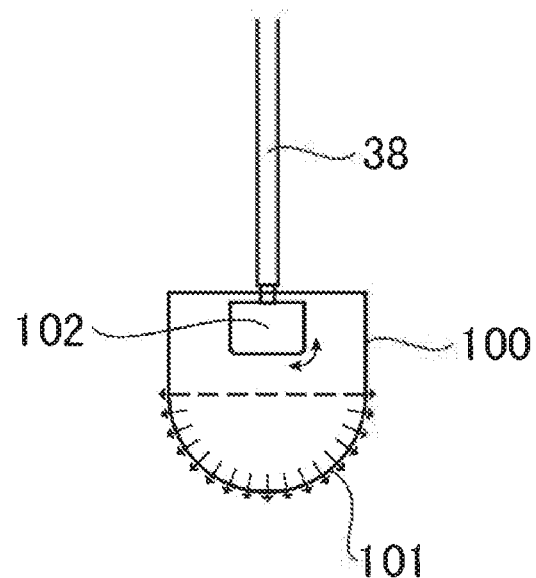
FIG. 13A is an essential portion front view showing a plating apparatus according to a third embodiment of the invention.
Figure 13B:
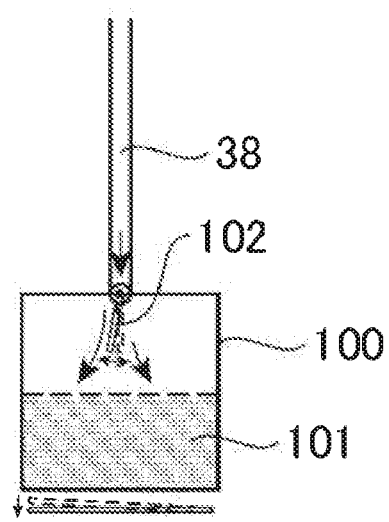
FIG. 13B is an essential portion side view showing the plating apparatus according to the third embodiment of the invention.

FIG. 13A and FIG. 13B are an essential portion front view and an essential portion side view of a plating apparatus of the embodiment. The plate shaped rudder member 102 is mounted in a manner pivotal around a vicinity of an end of the plating liquid supply pipe 38 at the end of the plating liquid supply pipe 38 in the spouting unit 100 having an upper side in a rectangular shape and a lower side in a half cylindrical shape. The rudder member 102 is capable of controlling the flow direction of the plating liquid flowing into the spouting unit 100 from the end of the plating liquid supply pipe 38 by the direction of the rudder member 102. The rudder member 102 can be set to a prescribed angle with such as a screw, or can be controlled to change the angle of the rudder member 102 by a motor, not shown.

By using the rudder member 102 for controlling the flow direction of the plating liquid, the apparatus renders the plating liquid spouting from a circumferential surface 101 of the spouting unit 100 also have a directionality, and for example, the apparatus can increase the liquid pressure of the plating liquid on a right side of the resin film and at the same time can decrease the liquid pressure of the plating liquid on a left side of the resin film relatively, thereby being capable of correcting the inclination where the resin film is inclined. Moreover, with respect to the conveyance direction of the resin film, the liquid pressure of the plating liquid can be increased on an upstream side and at the same time can be decreased on a downstream side. With this control, the apparatus can prevent the resin film 20 from conveyed in a meandering manner, thereby making the conveyance stable.

Figure 14A:
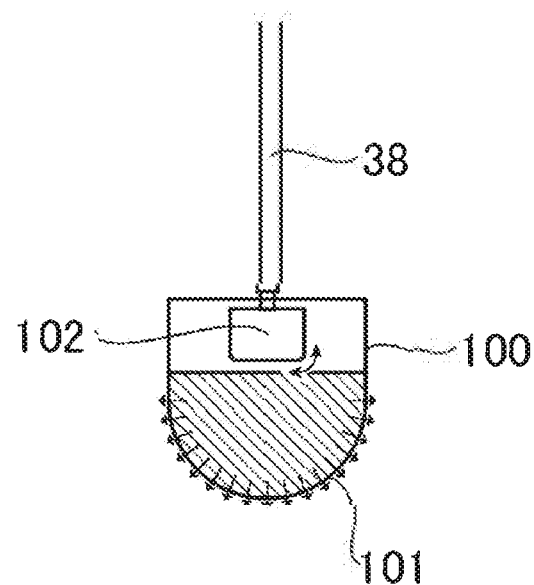
FIG. 14A is an essential portion front view showing one of modified embodiments of the plating apparatus according to the third embodiment of the invention.
Figure 14B:
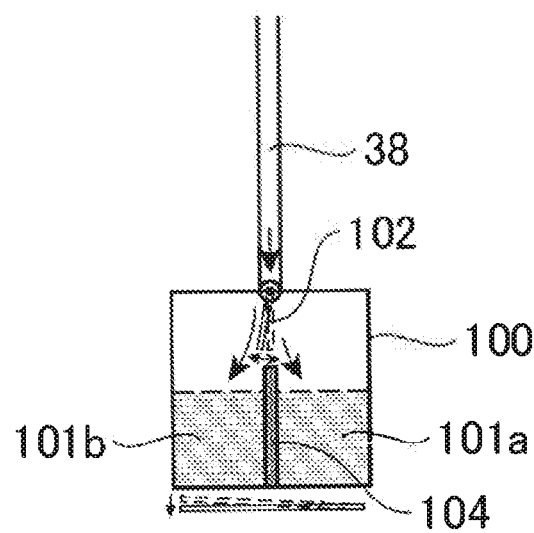
FIG. 14B is an essential portion side view showing the one of modified embodiments of the plating apparatus according to the third embodiment of the invention.

FIG. 14A and FIG. 14B shows a plating apparatus having mostly the same structure as the spouting unit 100 as an essential portion of the plating apparatus of the embodiment shown in FIG. 13A and FIG. 13B. A partition plate 104 is provided in a projecting manner on a circumferential side of the inside of the spouting unit 100. The partition plate 104 is arranged at approximately the center of the circumferential surface to divide the circumferential surface into two parts and so as to face the rudder member 102. With this partition plate 104, the interior of the spouting unit 100 can be divided into a right side portion 101a and a left side portion 101b with respect to the width direction of the resin film, and when the rudder member 102 is manipulated, the spouting amount of the plating liquid can be differentiated between the right side portion 101a and the left side portion 101b. Accordingly, the apparatus can prevent the resin film from contacting the spouting unit 100 and make the resin film conveyed stably.

Fourth Embodiment

As shown in FIG. 14 through FIG. 18, this embodiment is a plating apparatus including a spouting unit having two or more chambers separated from each other, and a rudder member inside the spouting unit to control the plating liquid spouting out of the spouting unit. It is to be noted that where the plating apparatus in this embodiment has the same structural elements as those of the plating apparatus in the previous embodiment, the same reference numbers are assigned, and duplicated descriptions are omitted.

Figure 15:
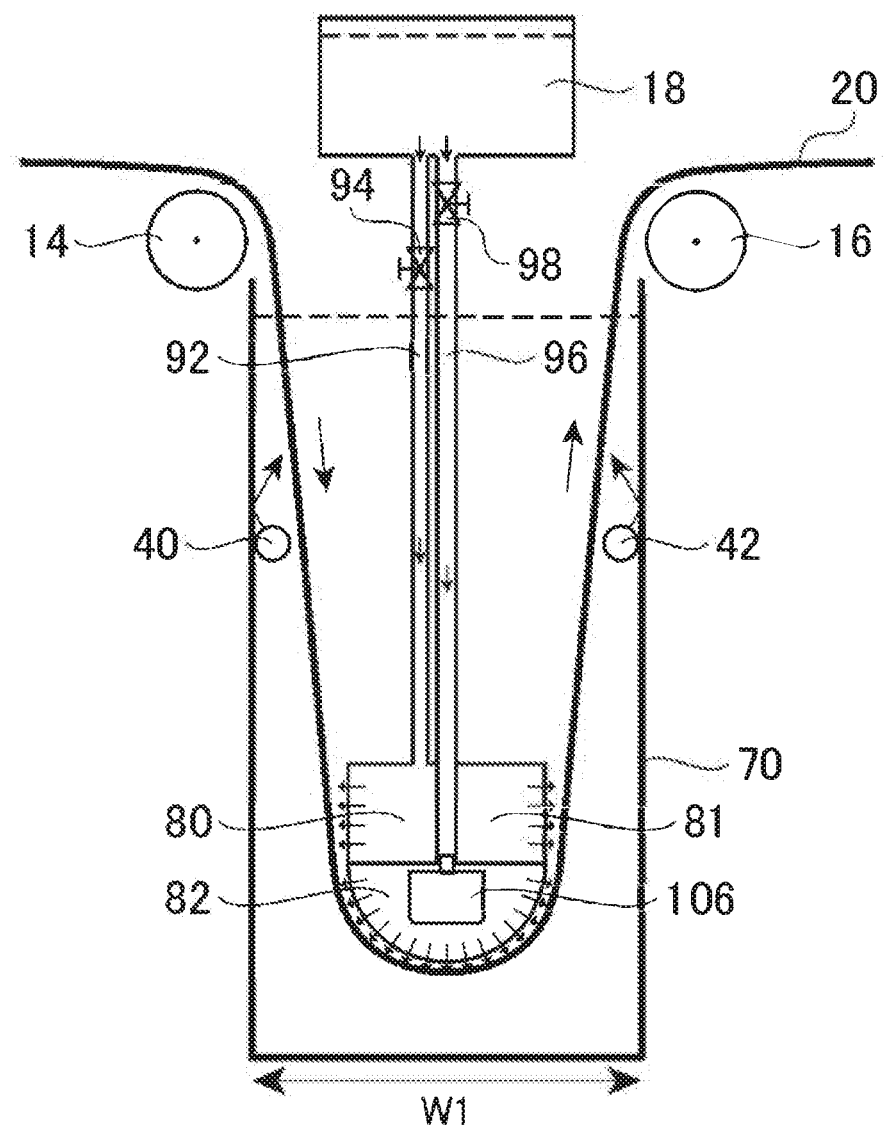
FIG. 15 is a structural diagram showing a plating apparatus according to a fourth embodiment of the invention.

As shown in FIG. 15, the plating apparatus of the embodiment, substantially the same way as the plating apparatus shown in FIG. 10, includes a processing bath 70 having a relatively narrow span W1, and a spouting unit 81 arranged inside the processing bath 70 includes a first chamber 80 disposed on an upper side of the unit and a second chamber 82 disposed on a lower side of the unit. The first chamber 80 and the second chamber 82 are coupled to the head tank 18 via the plating liquid supply pipes 92, 96 independent from each other and via the valves 94, 98. The first chamber 80 has holes spouting the plating liquid to an upper half of the spouting unit 81, and discharges spouting flow from the holes in a horizontal direction. The second chamber 82 has holes spouting the plating liquid to a lower half of the spouting unit 81, and discharges spouting flow in radial directions from the holes along the circumferential surface of the spouting unit 81.

With the plating apparatus of the embodiment, the flow amounts in the supply pipes can be controlled respectively and independently by manipulating the valves 94, 98, so that the position of the resin film 20 from the spouting unit can be stabilized, and so that formation of the uniform plating film can be performed advantageously. In the plating apparatus of the embodiment, a plate shaped rudder member 106 is mounted in a manner pivotal around a vicinity of an end of the plating liquid supply pipe 96 at the end of the plating liquid supply pipe 96 in the spouting unit 81. The rudder member 106 controls the flow direction of the plating liquid flowing into the second chamber 82 of the spouting unit 81 from the end of the plating liquid supply pipe 96 by the direction of the rubber member 106. Accordingly, where the resin film is inclined, the inclination can be corrected by manipulating the rudder member 106.

Figure 16:
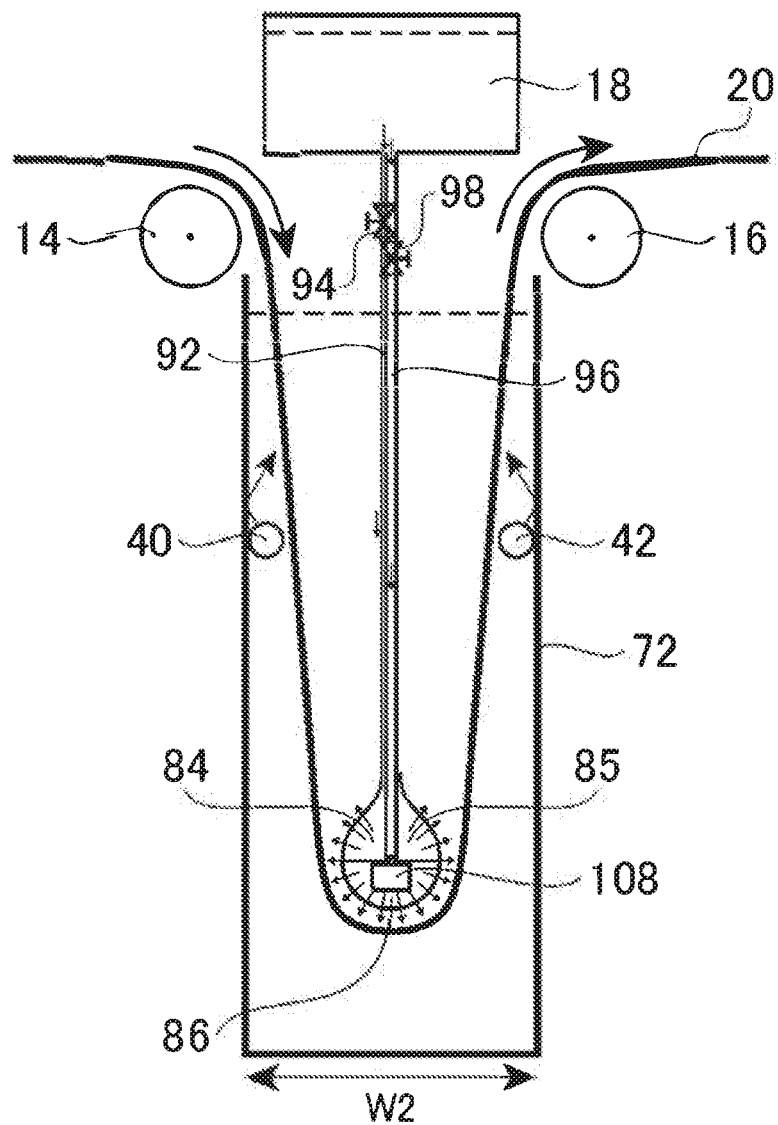
FIG. 16 is a structural diagram showing one of modified embodiments of the plating apparatus according to the fourth embodiment of the invention.
Figure 17:
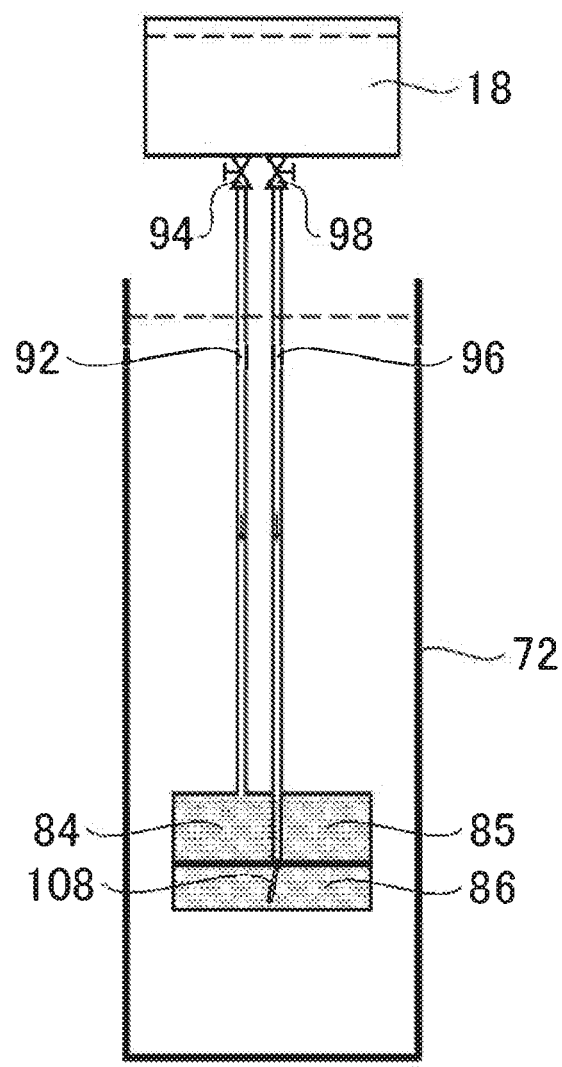
FIG. 17 is a side view showing the one of the modified embodiments of the plating apparatus shown in FIG. 16.

A plating apparatus shown in FIG. 16 and FIG. 17 is formed with a spouting unit 85 arranged inside and formed on a cross-sectionally spindle shape in a size corresponding to a further narrower span W2, and the relatively compact spouting unit 85 includes a first chamber 84 disposed on an upper side of the unit and a second chamber 86 disposed on a lower side of the unit. The first chamber 84 and the second chamber 86 are coupled to the head tank 18 via the plating liquid supply pipes 92, 96 independent from each other and via the valves 94, 98. The first chamber 84 has holes spouting the plating liquid to an upper half of the spouting unit 85, and discharges spouting flow in upward radial directions from the holes. The second chamber 86 has holes spouting the plating liquid to a lower half of the spouting unit 85, and discharges spouting flow in downward radial directions along the circumferential surface of the spouting unit 85.

In substantially the same way as the plating apparatus shown in FIG. 11, the plating apparatus shown in FIG. 16 and FIG. 17 can control the flow amounts in the supply pipes respectively and independently by manipulating the valves 94, 98, thereby making stable the position of the resin film 20 from the spouting unit, and thereby forming the uniform plating film advantageously. In the plating apparatus of the embodiment, a plate shaped rudder member 108 is mounted in a manner pivotal around a vicinity of an end of the plating liquid supply pipe 96 at the end of the plating liquid supply pipe 96 in the spouting unit 85. The rudder member 108 controls the flow direction of the plating liquid flowing into the second chamber 86 of the spouting unit 85 from the end of the plating liquid supply pipe 96 by the direction of the rubber member 108. Accordingly, where the resin film 20 is inclined, the inclination can be corrected by manipulating the rudder member 108.

Figure 18:
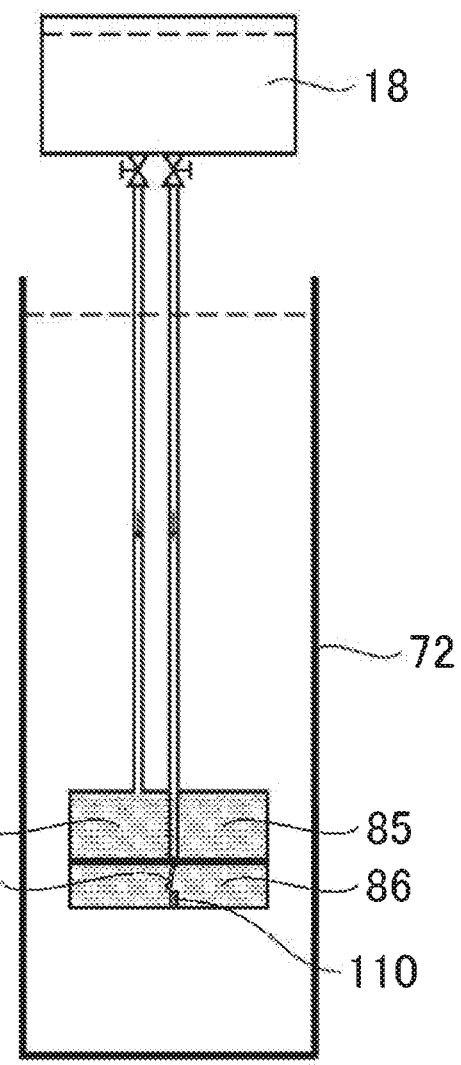
FIG. 18 is a structural diagram showing another one of the modified embodiments of the plating apparatus according to the fourth embodiment of the invention.

The plating apparatus shown in FIG. 18, in addition to the structure of the plating apparatus shown in FIG. 17, includes a partition plate 110, and with the partition plate 110, the inside of the spouting unit can be divided into, e.g., a right side portion and a left side portion in the width direction of the resin film. If the rudder member 108 is manipulated, the flow amounts of the plating liquid can be differentiated between the right side portion and the left side portion. Accordingly the apparatus can prevent the resin film from contacting the spouting unit and make the resin film conveyed stably.

Fifth Embodiment

Figure 19:
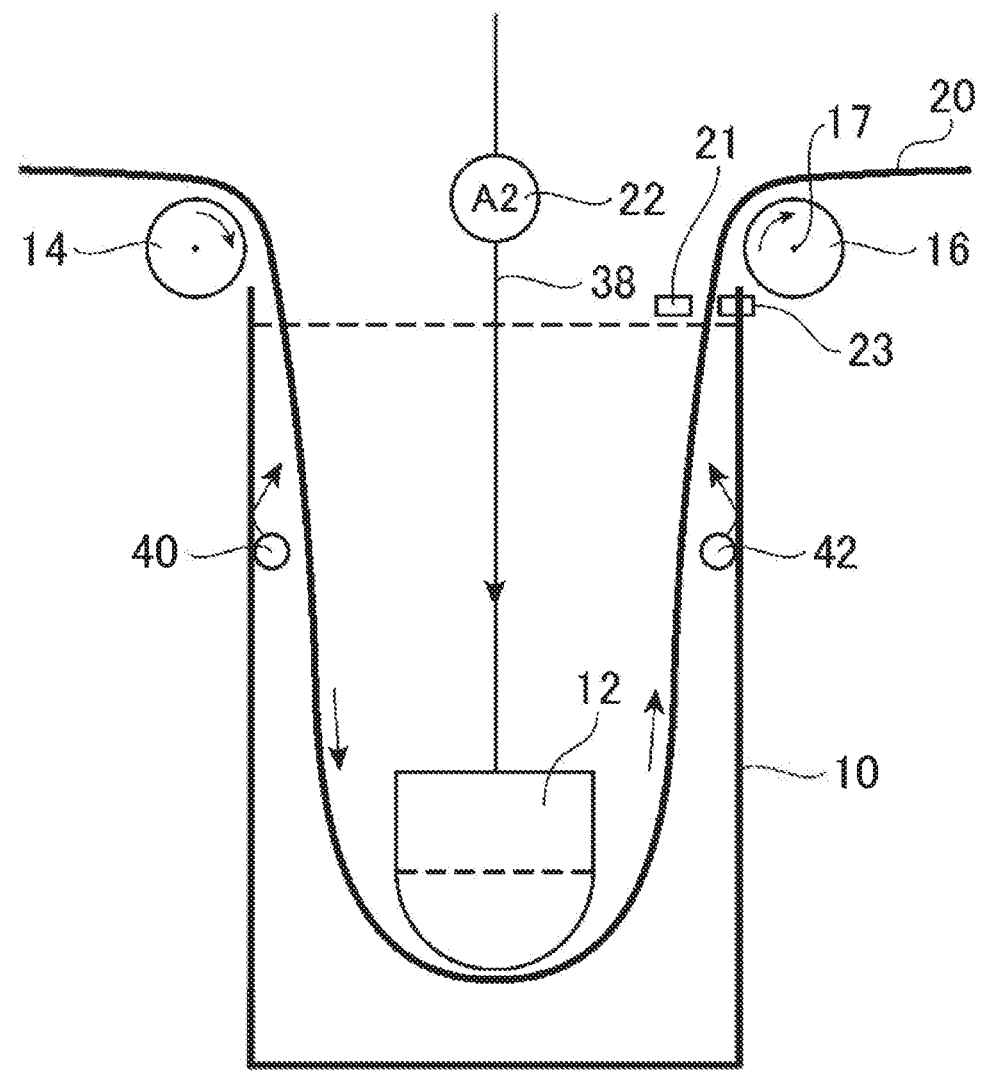
FIG. 19 is a structural diagram showing a plating apparatus according to a fifth embodiment of the invention.
Figure 20A:
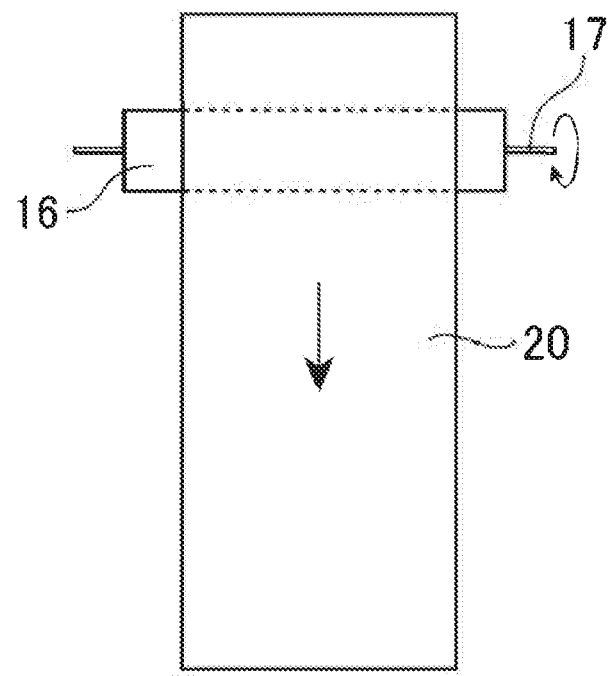
FIG. 20A is an illustration showing a normal conveyance state of the film at the plating apparatus according to the fifth embodiment of the invention.
Figure 20B:
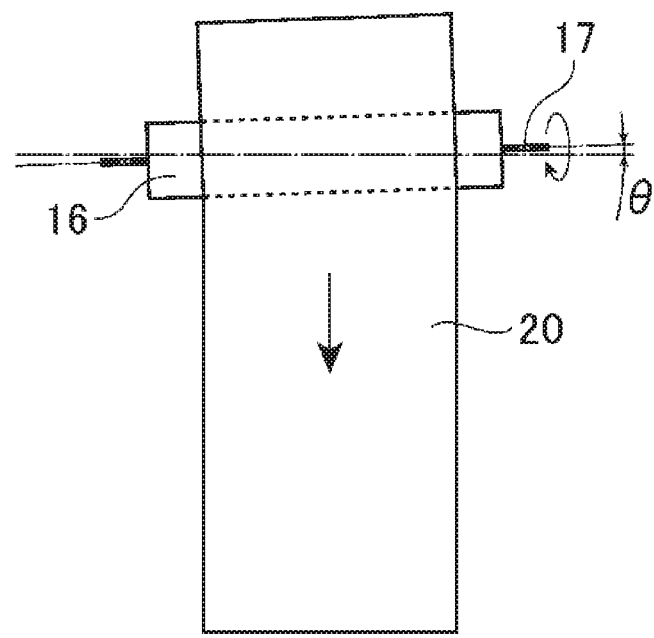
FIG. 20B is an illustration showing a conveyance state during meandering motion of the film at the plating apparatus according to the fifth embodiment of the invention.

As shown in FIG. 19 and FIGS. 20A and 20B, the embodiment has a mechanism for preventing the resin film 20 from being conveyed in a meandering manner, and a rotation shaft 17 of the delivery roller 16 is controlled to swing as shown with an angle θ on one end side, thereby correcting meandering feed during the conveyance. FIG. 19 shows the plating apparatus according to the embodiment, and a pair of photo sensors 21, 23 for detecting meandering conveyance is arranged near the delivery roller 16 on the delivery side of the resin film 20. Likewise the transmission type sensors 44, 46 described above, one of those photo sensors 21, 23 is a light emitting element while the other is a photo receiving element. It is to be noted that where the plating apparatus in this embodiment has the same structural elements as those of the plating apparatus in the previous embodiment, the same reference numbers are assigned, and duplicated descriptions are omitted.

The photo sensors 21, 23 can monitor as to whether the resin film 20 is conveyed in a deviated manner from monitoring at the attached position. That is, in a case of a normal conveyance status as shown in FIG. 20A, the rotation shaft 17 of the delivery roller 16 may not be moved. In a case where any meandering conveyance occurs, the pair of the photo sensors 21, 23 detects the occurrence, and an actuator not shown for the rotation shaft 17 operates. According to the operation of the actuator, the delivery roller 16 is controlled as to swing with an angle θ on the one end side. The feedback control thus described can correct meandering move of the film, and particularly, even where the handling is not easy as the resin film is a thin polyimide film, the apparatus realizes stable film conveyance.

Sixth Embodiment

Figure 21:
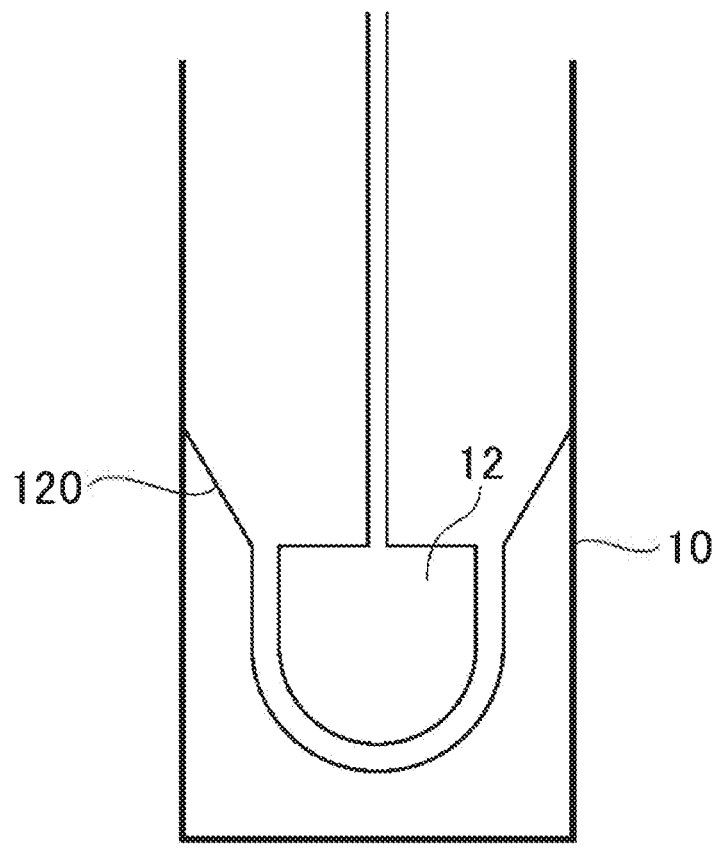
FIG. 21 is a structural diagram showing a plating apparatus according to a sixth embodiment of the invention.
Figure 22:
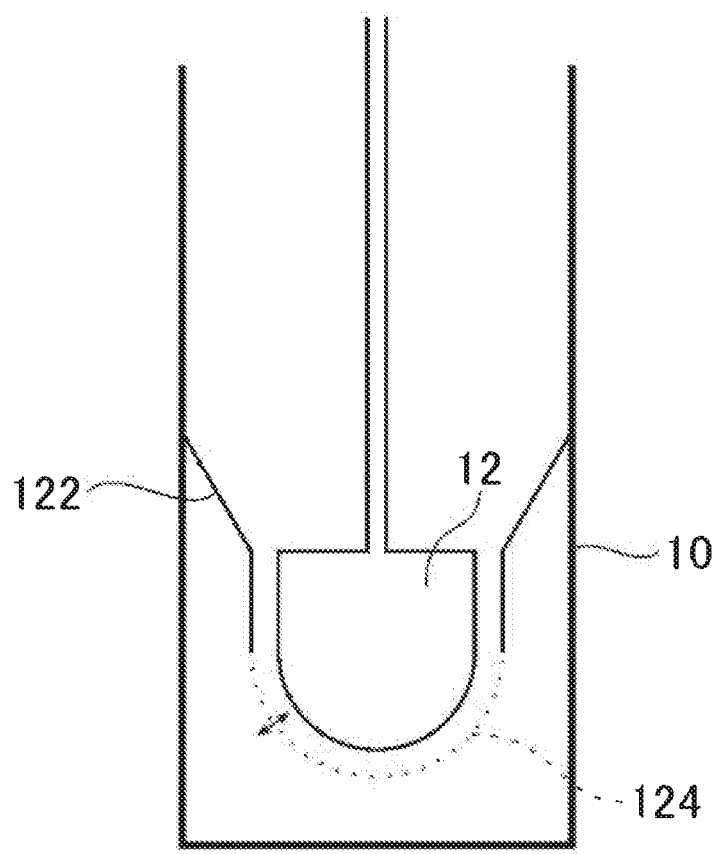
FIG. 22 is a structural diagram showing one of modified embodiments of the plating apparatus according to the sixth embodiment of the invention.
Figure 23:
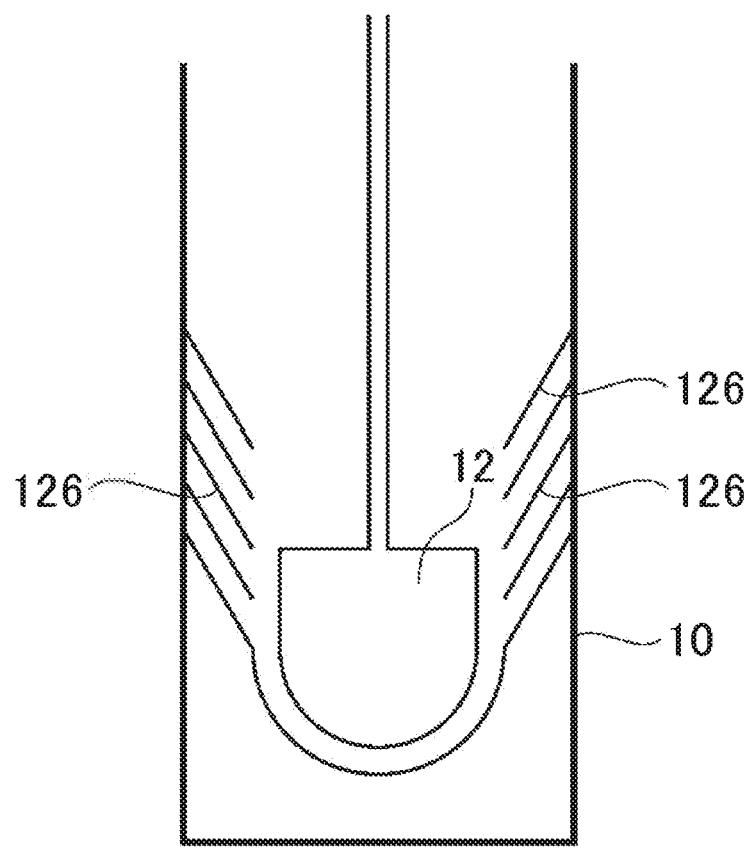
FIG. 23 is a structural diagram showing another one of the modified embodiments of the plating apparatus according to the sixth embodiment of the invention.

This embodiment is an example forming letter-U shaped guide portions 120, 122, 124, 126 on a bottom side of the conveyance path. The letter-U shaped guide portion 120 shown in FIG. 21 has a letter-U shape along a circumferential surface of the spouting unit 12, effectively prevents the position of the film from being disordered near the inlet portion and outlet portion of the spouting unit due to uprising flow of the liquid spouting from the spouting unit, thereby making the film conveyed surely and stably. The letter-U shaped guide portion 122 shown in FIG. 22 is formed with holes 124 on a bottom side or has a mesh structure, allowing the liquid to move freely between a vicinity of the film and the exterior of the guide 122 via the holes 124 or the structure, thereby making stable the liquid flow on the front side and the back side near the film. The letter-U shaped guide portion 126 shown in FIG. 23 can make smooth liquid flow near the inlet portion and outlet portion of the spouting unit by obliquely extending side louver portions, thereby making the conveyance stable.

Seventh Embodiment

Figure 24:
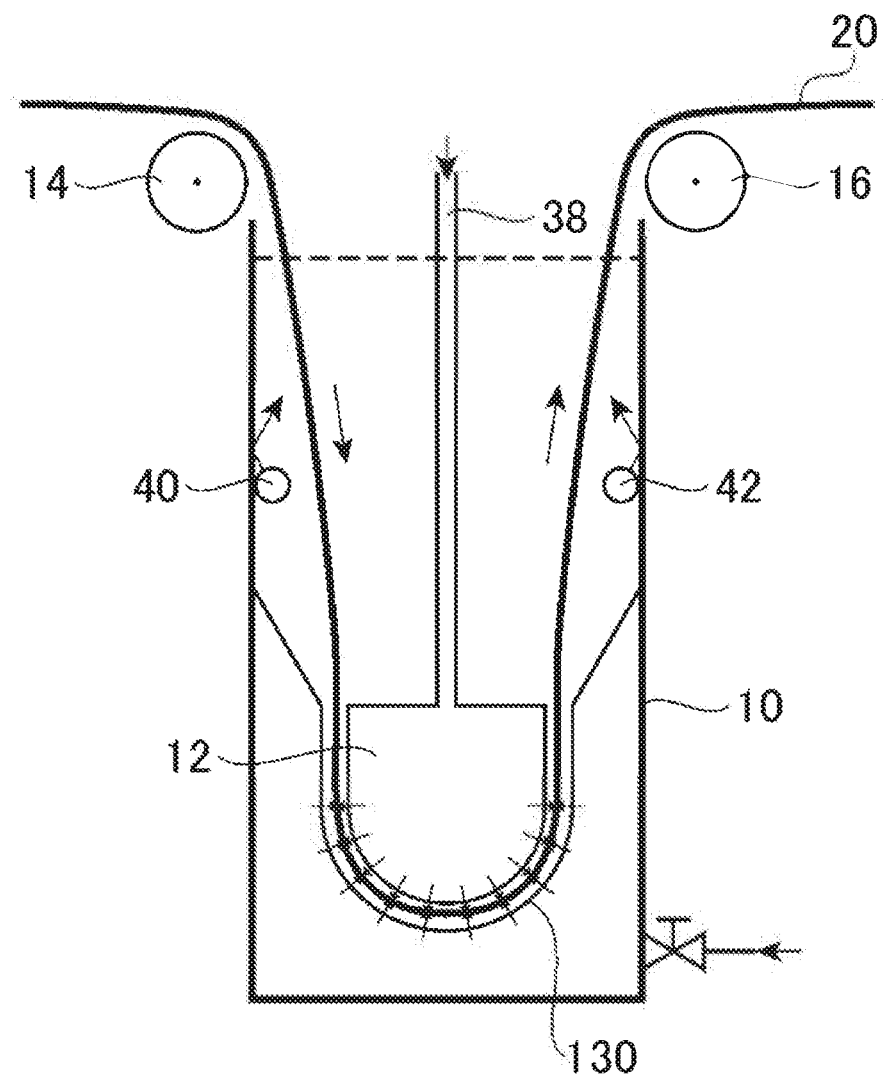
FIG. 24 is a structural diagram showing a plating apparatus according to a seventh embodiment of the invention.
Figure 25:
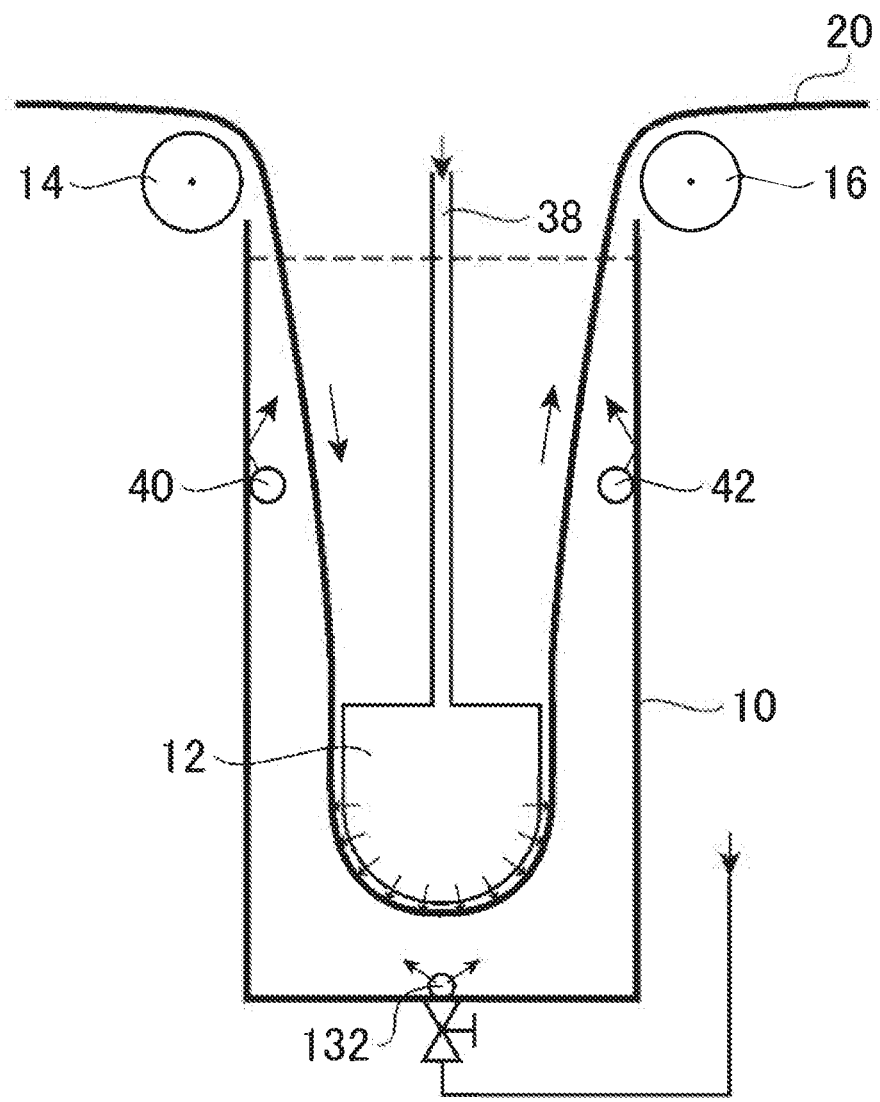
FIG. 25 is a structural diagram showing one of modified embodiments of the plating apparatus according to the seventh embodiment of the invention.
Figure 26:
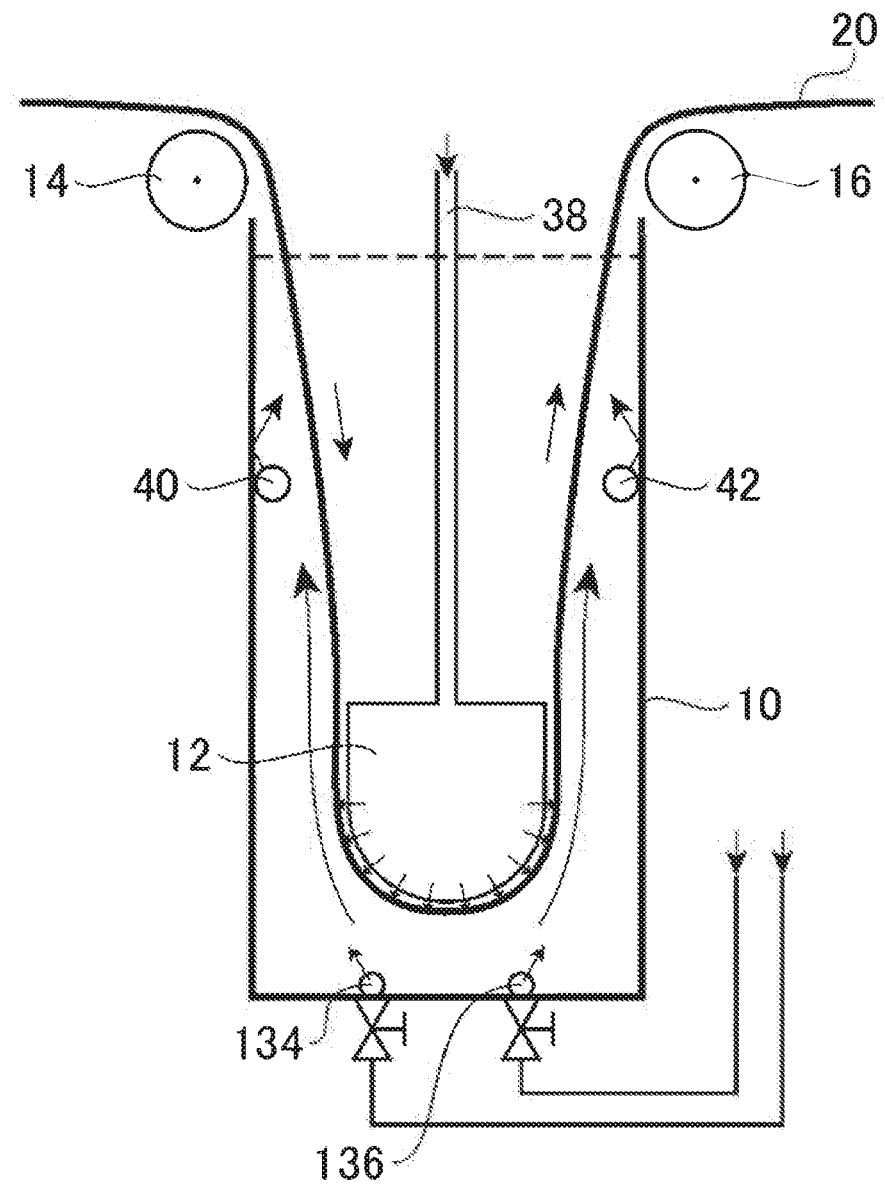
FIG. 26 is a structural diagram showing another one of the modified embodiments of the plating apparatus according to the seventh embodiment of the invention.

This embodiment is, as shown in FIG. 24 through FIG. 26, examples in which bottom spouting portions 130, 132, 134, 136 are provided for supplying the plating liquid to a surface on a side that the spouting unit 12 is not arranged when viewed from the resin film 20. The bottom spouting portion 130 shown in FIG. 24 is a device supplying the plating liquid from a bottom side surface of the plating apparatus. The bottom spouting portion 132 shown in FIG. 25 is a device supplying the plating liquid from the bottom of the plating apparatus. The pair of the bottom spouting portions 134, 136 shown in FIG. 26 are devices supplying the plating liquid respectively from the bottom of the plating apparatus. The plating liquid is supplied to those bottom spouting portions 130, 132, 134, 136 from the head tank 18 via the valve. By providing liquid flows on double sides, or on the front side (inner side of turning portion) and the back side (outer side of the turning portion) with respect to the resin film, or namely, by supplying the plating liquid from the spouting unit 12 to the front side of the film as well as supplying the plating liquid from those bottom spouting portions 130, 132, 134, 136 to the back side of the film, the apparatus can enjoy an advantage that the plating thickness becomes uniform; by conveying the film in the liquid flow giving the liquid pressure on the double sides, the film can be conveyed stably; by setting the liquid flow direction properly, the conveyance can be made stable.

Eighth Embodiment

Figure 27:
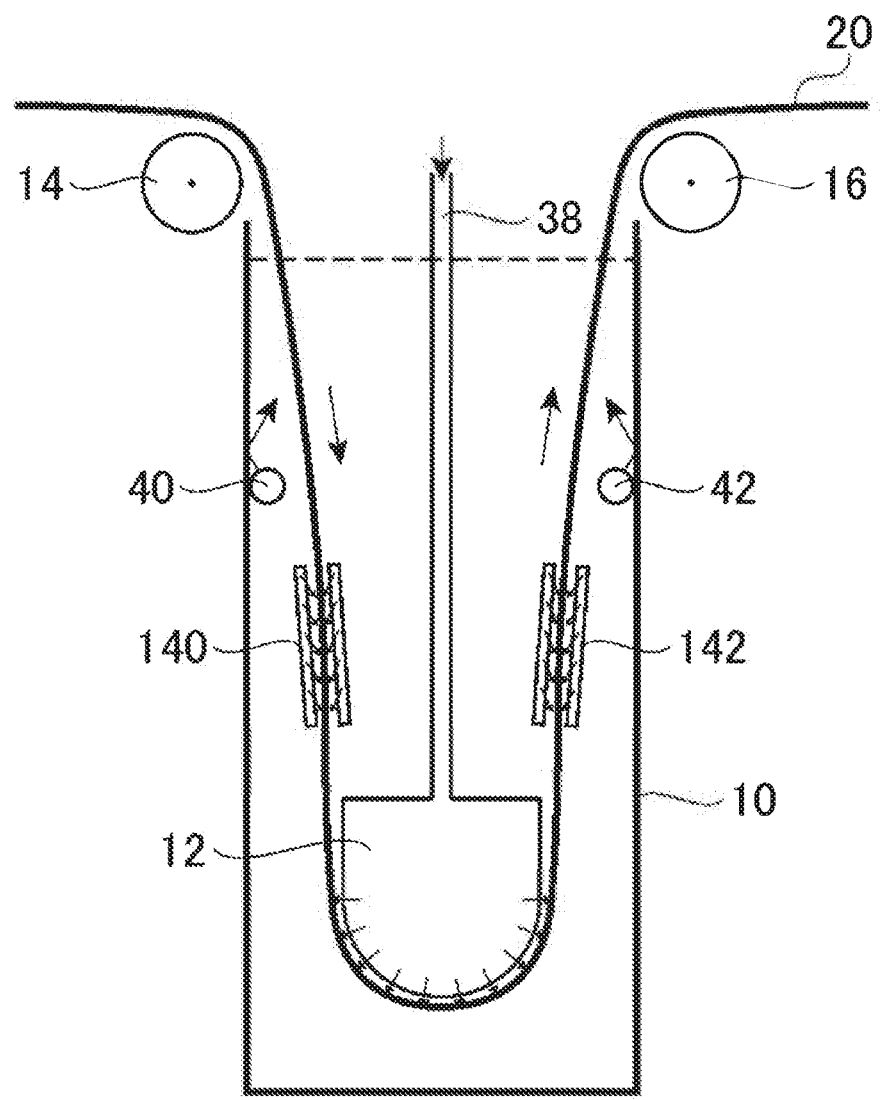
FIG. 27 is a structural diagram showing a plating apparatus according to an eighth embodiment of the invention.
Figure 28:
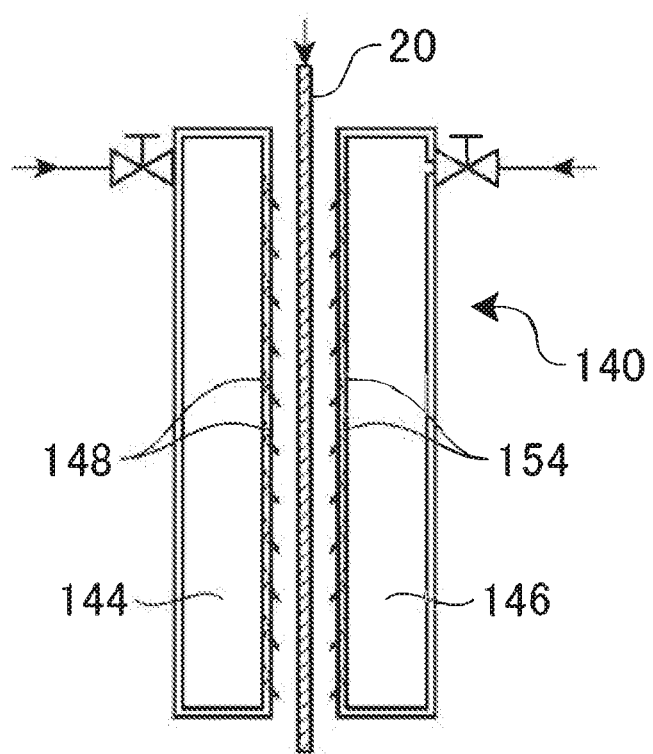
FIG. 28 is a structural view showing one embodiment of a side spouting plate arranged at the plating apparatus shown in FIG. 27.
Figure 29:
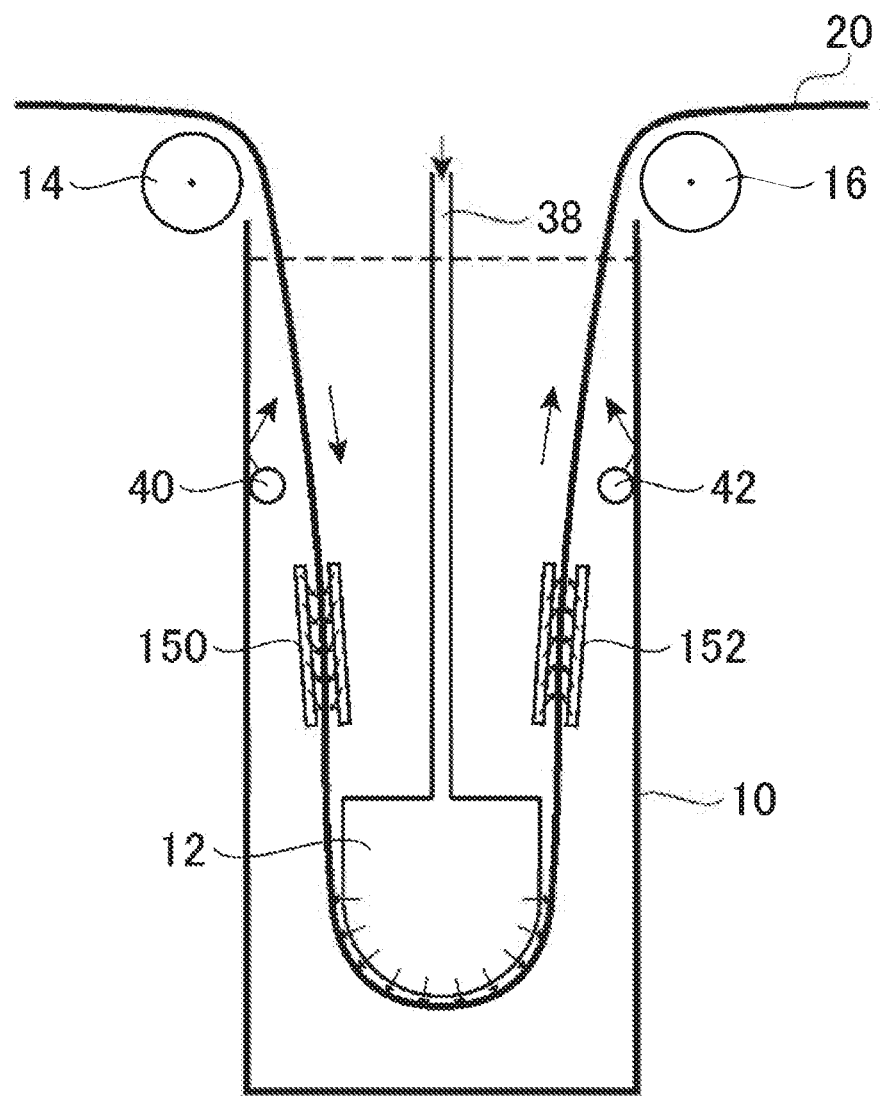
FIG. 29 is a structural diagram showing one of the modified embodiments of the plating apparatus according to the eighth embodiment of the invention.

This embodiment is, as shown in FIG. 27 to FIG. 29, examples of plating apparatuses in which side spouting plates 140, 142, 150, 152 are provided between the spouting unit 12 and the loading roller 14 and between the spouting unit 12 and the delivery roller 16. FIG. 27 and FIG. 29 show structures of the plating apparatuses, respectively, and FIG. 28 shows a cross-sectional structure of the side spouting plate 140.

As shown in FIG. 28, the side spouting plate 140 includes a pair of body portions 144, 146 made of a resin such as PVC, and has a structure to pass the resin film 20 through a gap between the pair of the body portions 144, 146. The pair of the body portions 144, 146 is hollow and is supplied with plating liquid from the head tank 18 as described above via the valve. The gap for passing the resin film 20 is formed with plural holes 148, 154 arranged across the whole gap portion between the pair of the body portions 144, 146 so as to render oblique directions with respect to the film conveyance direction become the spouting directions, and by spouting the plating liquid from the plural holes 148, 154, stable film conveyance can be made. Among the pair of the body portions 144, 146, a unit disposed on an inner side of the resin film is referred to as an inner side unit while a disposed on an outer side of the resin film is referred to as an outer side unit.

If the resin film 20 is in a state not tensioned but loosen near the inlet and outlet of the resin film 20 to the spouting unit 12, the film conveyance tends to be not stable. Where the side spouting plates 140, 142, 150, 152 are provided near the inlet and outlet of the spouting unit 12, such unstable tendency is removed. The liquid spouting angles and the liquid flows of the side spouting plates 140, 142, 150, 152 can be properly adjusted, and it is desirable to install the plates so that the resin film 20 is loaded and unloaded to and from the spouting unit 12 without subject to any loosen state.

The plating apparatus shown in FIG. 27 includes the side spouting plates 140, 142, and the side spouting plates 140, 142 are disposed to have the same spouting direction on the inlet side and the outlet side of the spouting unit 12. The plating apparatus shown in FIG. 29 includes the side spouting plates 150, 152, and the side spouting plates 150, 152 are disposed to have the spouting direction opposite to each other on the inlet side and the outlet side of the spouting unit 12. The spouting direction of the side spouting plates is selected according to the balance of the entire liquid flows. The plating liquid is spouted from the plural holes 148, 154 of the side spouting plates 140, 142, 150, 152, and therefore, stable film conveyance is obtained.

If the liquid flow of the outer side unit of the side spouting plates 140, 142, 150, 152 is set larger than the liquid flow of the inner side unit, the liquid flows pushing the film as a whole can be made substantially equal on the front and back sides, and the plating film thickness can be made uniform. That is, because the liquid flow from the spouting unit 12 exists on the inner side of the film, a small amount of the liquid flow from the side spouting plate can be enough. Although the side spouting plate is described as sandwiching the film, a side spouting plate provided on one side of the film may be provided. By monitoring the conveyance state of the resin film, the apparatus can control to move the side spouting plate, or to change the pressure of the plating liquid outputted from the spouting plate to make stable film conveyance. Where the film thicknesses to the resin film are different between on the front side (the turn portion inner side) and on the back side (the turn portion outer side), liquid flows on double sides, or namely on the front side (the turn portion inner side) and on the back side (the turn portion outer side), with respect to the film, are set, and the film conveyance is made with the liquid flows flushing on the double sides, thereby making stable the film conveyance.

This invention is not limited to above embodiments, and can be modified variously based on the subject of the invention. Those modified examples are not excluded from the scope of the invention.

What is claimed is:

1. A wet type processing apparatus for resin film, processing a coating treatment of a conductive metal on a surface of the resin film by dipping in a prescribed processing liquid a web formed resin film adsorbing metal ion catalyst on the surface thereof, comprising:
   a processing bath for reserving inside the processing liquid and rendering the resin film passing through the processing liquid;
   a pair of conveyance members arranged on a loading side for the resin film of the processing bath and on a delivery side for resin film of the processing bath at a position higher than a liquid surface of the processing liquid reserved in the processing bath; and
   a spouting unit arranged between the pair of the conveyance members at a position lower than the conveyance members and formed with a rectangular upper surface opposite a circumferential surface having a plurality of holes for spouting the processing liquid from the circumferential surface to change a direction of the resin film along the circumferential surface in a non-contact manner in the processing liquid according to spouted flows from the plurality of holes and wherein the plurality of holes are adjustable, such that a spouting angle may be adjusted;

a head tank connected to the spouting unit via a supply pipe, wherein the head tank is coupled at a position higher than the liquid surface of the processing liquid and the supply pipe further comprises a flow meter;

at least one transmission type sensor comprising a light emitting element and photo receiving element configured to monitor the resin film.

2. The wet type processing apparatus for resin film according to claim 1, wherein the processing liquid is an electroless metal plating liquid, and wherein a metal film formed with the electroless metal plating liquid comprises a seed layer for subsequent wet type formation of a metal film.

3. The wet type processing apparatus for resin film according to claim 1, wherein the resin film is a polyimide film or other heat insulating resin films.

4. The wet type processing apparatus for resin film according to claim 3, wherein the polyimide film has a thickness of 12.5 microns or lower.

5. The wet type processing apparatus for resin film according to claim 1, wherein the plurality of holes of the spouting unit provide a spouting flow of 100 liters or less per minute.

* * * * *